United States Patent
Yun et al.

(10) Patent No.: US 8,475,998 B2
(45) Date of Patent: Jul. 2, 2013

(54) COMPOUND SYNTHESIS METHOD, MICROARRAY, ACID-TRANSFER COMPOSITION, AND BIOCHIP COMPOSITION

(75) Inventors: Hyojin Yun, Gyeonggi-Do (KR); Changeun Yoo, Gyeonggi-Do (KR); Myung-Sun Kim, Gyeonggi-Do (KR); Soo-Kyung Kim, Gyeonggi-Do (KR); Kouji Nishikawa, Tokyo (JP); Hirofumi Goto, Tokyo (JP); Hidetoshi Miyamoto, Tokyo (JP)

(73) Assignees: Samsung Electronics Co., Ltd., Hwasung (KR); JSR Corporation, Tokyo (JP)

(*) Notice: Subject to any disclaimer, the term of this patent is extended or adjusted under 35 U.S.C. 154(b) by 0 days.

(21) Appl. No.: 13/329,619

(22) Filed: Dec. 19, 2011

(65) Prior Publication Data
US 2012/0196772 A1 Aug. 2, 2012

(30) Foreign Application Priority Data
Dec. 20, 2010 (JP) ................... 2010-283611

(51) Int. Cl.
G03F 7/00 (2006.01)
G03F 7/004 (2006.01)
G03F 7/07 (2006.01)
G03F 7/11 (2006.01)
C40B 40/04 (2006.01)
C40B 40/06 (2006.01)
C40B 40/08 (2006.01)
C40B 40/10 (2006.01)
C40B 40/12 (2006.01)

(52) U.S. Cl.
USPC ........... 430/273.1; 430/270.1; 430/271.1; 430/283.1; 506/15; 506/16; 506/17; 506/18; 506/19

(58) Field of Classification Search
USPC ............. 506/16, 18, 19, 23; 536/23.1, 25.3; 430/283.1, 320, 324
See application file for complete search history.

(56) References Cited

U.S. PATENT DOCUMENTS

| | | | |
|---|---|---|---|
| 5,445,934 A | 8/1995 | Fodor et al. | |
| 5,658,734 A | 8/1997 | Brock et al. | |
| 5,744,305 A | 4/1998 | Fodor et al. | |
| 6,359,125 B1 | 3/2002 | Kim et al. | |
| 6,426,184 B1 | 7/2002 | Gao et al. | |
| 7,053,198 B2* | 5/2006 | Goldberg et al. | 536/23.1 |
| 2010/0190109 A1* | 7/2010 | Nishikawa | 430/283.1 |

OTHER PUBLICATIONS

K.J. Stewart et al., "Simple negative resist for deep ultraviolet, electron beam, and x-ray lithography", American Vacuum Society, 1989, pp. 1734-1739, B7(6).

Fodor et al., "Light-Directed, Spatially Addressable Parallel Chemical Synthesis", Science, 1991, pp. 767-773, vol. 251.

* cited by examiner

*Primary Examiner* — Samuel Woolwine
*Assistant Examiner* — Kaijiang Zhang
(74) *Attorney, Agent, or Firm* — Ditthavong Mori & Steiner, P.C.

(57) ABSTRACT

A compound synthesis method includes bonding a first compound to a substrate to form a first film. A second film is formed on the first film using an acid-transfer composition including (A) a polymer that includes a structural unit shown by a following formula (1) and a structural unit shown by a following formula (2), (B) a photoacid generator shown by a following formula (3), and (C) a sensitizer shown by a following formula (4). The second film is exposed to remove the protecting group from the first compound under an exposed area of the second film. An acid generated in the exposed area of the second film is transferred to the first film. The second film after being exposed is removed. A second compound is bonded to the first compound from which the protecting group has been removed.

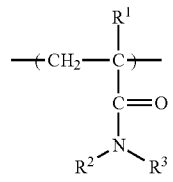 (1)
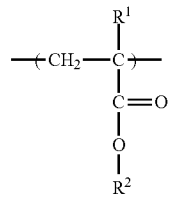 (2)
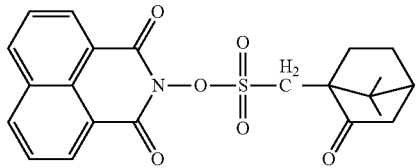 (3)
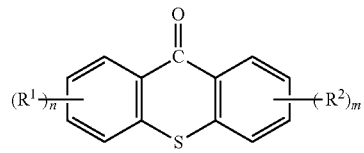 (4)
12 Claims, 3 Drawing Sheets

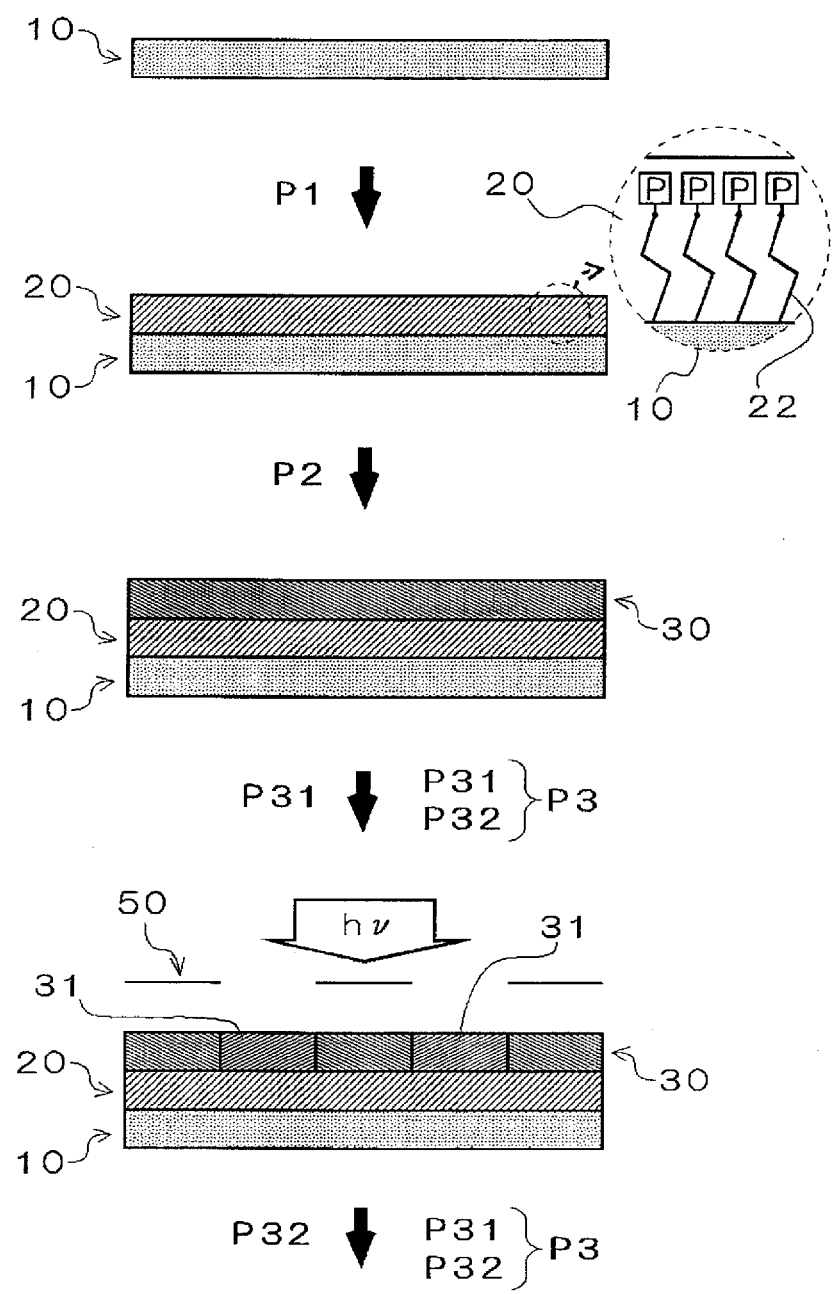

COMPOUND SYNTHESIS METHOD, MICROARRAY, ACID-TRANSFER COMPOSITION, AND BIOCHIP COMPOSITION

CROSS-REFERENCE TO RELATED APPLICATIONS

The present application claims priority under 35 U.S.C. §119 to Japanese Patent Application No. 2010-283611, filed Dec. 20, 2010. The contents of this application are incorporated herein by reference in their entirety.

BACKGROUND OF THE INVENTION

1. Field of the Invention

The invention relates to a compound synthesis method, a microarray, an acid-transfer composition, and a biochip composition.

2. Discussion of the Background

A method that synthesizes a biopolymer on a substrate has been known. For example, Fordor et al. propose a synthesis method that links a nucleic acid and an amino acid including a UV-labile protecting group to the surface of a solid, exposes a specific area of the surface of a solid by utilizing a photolithography mask to remove the protecting group, and reacts the nucleic acid or the amino acid with a nucleic acid or an amino acid including a light-labile protecting group so that the nucleic acid or the amino acid is extended (polymerized) at a specific position (see U.S. Pat. No. 5,445,934 and U.S. Pat. No. 5,744,305, for example).

According to the above method, since an oligonucleotide probe having a specific sequence and a specific length can be selectively synthesized at a specific position, the above method is useful for synthesizing oligonucleotide probes having the desired sequence and length at a specific position. Moreover, since the above method utilizes a microfabrication mask used for a semiconductor production process, the above method is very useful for synthesizing oligonucleotide probes with a high degree of integration. The above patent document discloses that a sequencing method using an oligonucleotide probe that is more convenient and faster than the Sanger method is useful for producing oligonucleotide probes with a high degree of integration.

A photolithographic process that utilizes a photoresist (PR) used to form a fine pattern in a semiconductor production process has attracted attention as indispensable technology for increasing the degree of integration of a DNA chip. Since the size and the capacity of a semiconductor chip are determined depending on the resolution employed in the photolithographic process, the photolithographic process has influenced the development of semiconductor/microelectronics. The photolithographic process utilizes a difference in solubility between the exposed area and the unexposed area of the photoresist. A system in which the solubility of the exposed area decreases is referred to as a negative-tone system, and a system in which the solubility of the unexposed area decreases is referred to as a positive-tone system. The positive-tone system is mainly used for producing a semiconductor chip. A large number of oligonucleotide probes can be arranged on a chip having a limited area by utilizing the photolithographic process. A method that utilizes a photoresist (see U.S. Pat. No. 5,658,734, for example) and a method that utilizes a micromirror have been proposed as application examples of the photolithographic process.

A photolithographic process that utilizes a photoresist (hereinafter referred to as "PR process") has an advantage in that a material that has been developed or put on the market aimed at the semiconductor industry can be used. According to the PR process, when forming a pattern by applying light, and washing the exposed area, a normal solid-phase nucleic acid synthesis reaction occurs on the surface so that nucleotides are bound to the surface. In this case, a diazoquinone/cresol novolac resin that exhibits excellent interface adhesion is typically used as the photoresist. The diazoquinone/cresol novolac resin exhibits excellent pattern characteristics when using an i-line (365 nm), and has been used for a 16 Mbit DRAM process. A method that improves the method by providing a protective coating under the photoresist has been proposed (see J. Vac. Sci. Tech., 1989, B7(6), 1734, for example).

The PR process is roughly divided into a first stage that includes coating the photoresist, and forming a PR pattern by exposure and development, a second stage that includes removing the protecting group in the etched area, and removing the photoresist using an acid solution, and a third stage that includes sequentially bonding nucleic acid, and performing a post-treatment.

A photoacid patterned array (PPA) system has been proposed to improve the PR process (see U.S. Pat. No. 5,658,734, for example). The PPA system utilizes a polymer matrix mixed with a photoacid generator (PAG). According to the PPA system, an acid is generated only in the exposed area, and the protecting group is removed after a heat treatment. Therefore, the first stage and the second stage of the PR process can be performed in one stage.

A method that produces a DNA chip using a micromirror may be used to produce a DNA chip by utilizing photolithography. In this case, a support that can react with an oligonucleotide is formed on a solid substrate using a photoresist, and a solution of a photoacid generator is put in the support. A specific area is then exposed using the micromirror to generate an acid, so that a protecting group bonded to the oligonucleotide is removed, and the oligonucleotide is reacted. The oligonucleotides having the desired pattern can stacked by repeating the above operation. This method has an advantage over the PR process in that the chip can be simply produced.

A method that forms a peptide nucleic acid (PNA) array on a solid substrate by utilizing a polymer photoacid generator instead of mixing the photoacid generator into a polymer matrix has been disclosed in order to solve the above problems (see U.S. Pat. No. 6,359,125, for example).

SUMMARY OF THE INVENTION

According to one aspect of the present invention, a compound synthesis method includes bonding a first compound that includes an acid-labile protecting group to a substrate to form a first film. A second film is formed on the first film using an acid-transfer composition. The acid-transfer composition includes (A) a polymer that includes a structural unit shown by a following formula (1) and a structural unit shown by a following formula (2), (B) a photoacid generator including a compound shown by a following formula (3), and (C) a sensitizer including a compound shown by a following formula (4). The second film is exposed to remove the protecting group from the first compound under an exposed area of the second film. An acid generated in the exposed area of the second film is transferred to the first film. The second film after being exposed is removed. A second compound is bonded to the first compound from which the protecting group has been removed to synthesize a compound in which the first compound and the second compound are bonded.

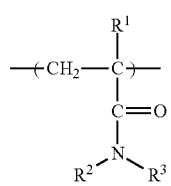

(1)

$R^1$ represents a hydrogen atom or a methyl group. Each of $R^2$ and $R^3$ independently represents a hydrogen atom, a linear or branched hydrocarbon group having 1 to 10 carbon atoms, or a cyclic hydrocarbon group having 3 to 10 carbon atoms. Or each of $R^2$ and $R^3$ independently represents a hydrogen atom, a linear or branched hydrocarbon group having 1 to 10 carbon atoms, or a cyclic hydrocarbon group having 3 to 10 carbon atoms, and $R^2$ and $R^3$ bond to form a 3 to 10-membered monocyclic hetero ring, or bond via at least one hetero atom selected from a nitrogen atom, an oxygen atom, a sulfur atom, and a selenium atom to form a 4 to 10-membered monocyclic hetero ring.

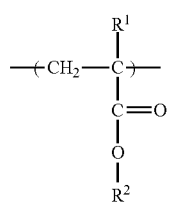

(2)

$R^1$ represents a hydrogen atom or a methyl group, and $R^2$ represents a monovalent organic group.

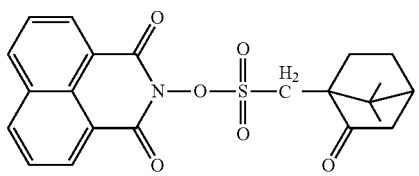

(3)

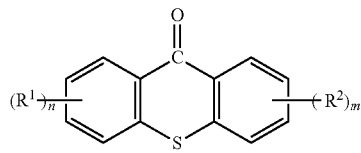

(4)

Each of $R^1$ and $R^2$ independently represents an alkyl group or a halogen atom, and each of n and m is independently an integer from 1 to 4.

According to another aspect of the present invention, an acid-transfer composition includes (A) a polymer that includes a structural unit shown by a following formula (1) and a structural unit shown by a following formula (2), (B) a photoacid generator including a compound shown by a following formula (3), and (C) a sensitizer including a compound shown by a following formula (4). The acid-transfer composition is used for a compound synthesis method. The method includes a first compound that includes an acid-labile protecting group to a substrate to form a first film. A second film is formed on the first film using the acid-transfer composition. The second film is exposed to remove the protecting group from the first compound under an exposed area of the second film. An acid generated in the exposed area of the second film is transferred to the first film. The second film after being exposed is removed. A second compound is bonded to the first compound from which the protecting group has been removed to synthesize a compound in which the first compound and the second compound are bonded.

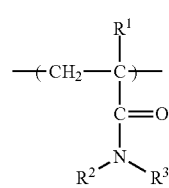

(1)

$R^1$ represents a hydrogen atom or a methyl group. Each of $R^2$ and $R^3$ independently represents a hydrogen atom, a linear or branched hydrocarbon group having 1 to 10 carbon atoms, or a cyclic hydrocarbon group having 3 to 10 carbon atoms. Or each of $R^2$ and $R^3$ independently represents a hydrogen atom, a linear or branched hydrocarbon group having 1 to 10 carbon atoms, or a cyclic hydrocarbon group having 3 to 10 carbon atoms, and $R^2$ and $R^3$ bond to form a 3 to 10-membered monocyclic hetero ring, or bond via at least one hetero atom selected from a nitrogen atom, an oxygen atom, a sulfur atom, and a selenium atom to form a 4 to 10-membered monocyclic hetero ring.

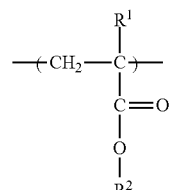

(2)

$R^1$ represents a hydrogen atom or a methyl group, and $R^2$ represents a monovalent organic group.

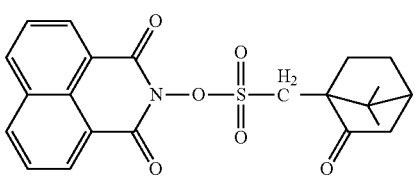

(3)

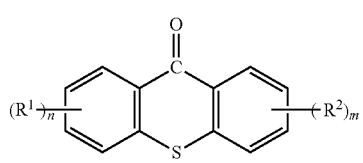

(4)

Each of $R^1$ and $R^2$ independently represents an alkyl group or a halogen atom, and each of n and m is independently an integer from 1 to 4.

According to further aspect of the present invention, A biochip composition includes (A) a polymer that includes a structural unit shown by a following formula (1) and a structural unit shown by a following formula (2), (B) a photoacid generator including a compound shown by a following formula (3), and (C) a sensitizer including a compound shown by a following formula (4).

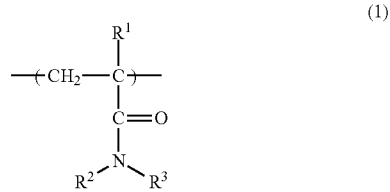

R¹ represents a hydrogen atom or a methyl group. Each of R² and R³ independently represents a hydrogen atom, a linear or branched hydrocarbon group having 1 to 10 carbon atoms, or a cyclic hydrocarbon group having 3 to 10 carbon atoms. Or each of R² and R³ independently represents a hydrogen atom, a linear or branched hydrocarbon group having 1 to 10 carbon atoms, or a cyclic hydrocarbon group having 3 to 10 carbon atoms, and R² and R³ bond to form a 3 to 10-membered monocyclic hetero ring, or bond via at least one hetero atom selected from a nitrogen atom, an oxygen atom, a sulfur atom, and a selenium atom to form a 4 to 10-membered monocyclic hetero ring.

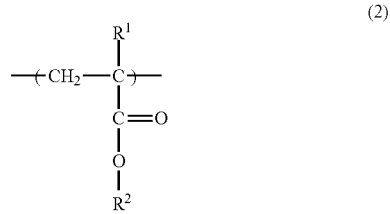

R¹ represents a hydrogen atom or a methyl group, and R² represents a monovalent organic group.

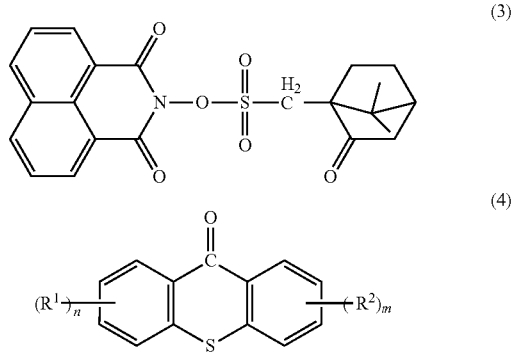

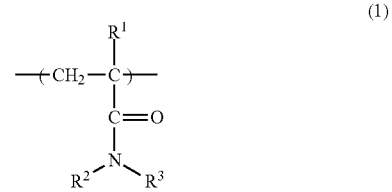

Each of R¹ and R² independently represents an alkyl group or a halogen atom, and each of n and m is independently an integer from 1 to 4.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 1 is a view schematically illustrating a compound synthesis method according to one embodiment of the invention.

DESCRIPTION OF THE EMBODIMENTS

Figure 2:
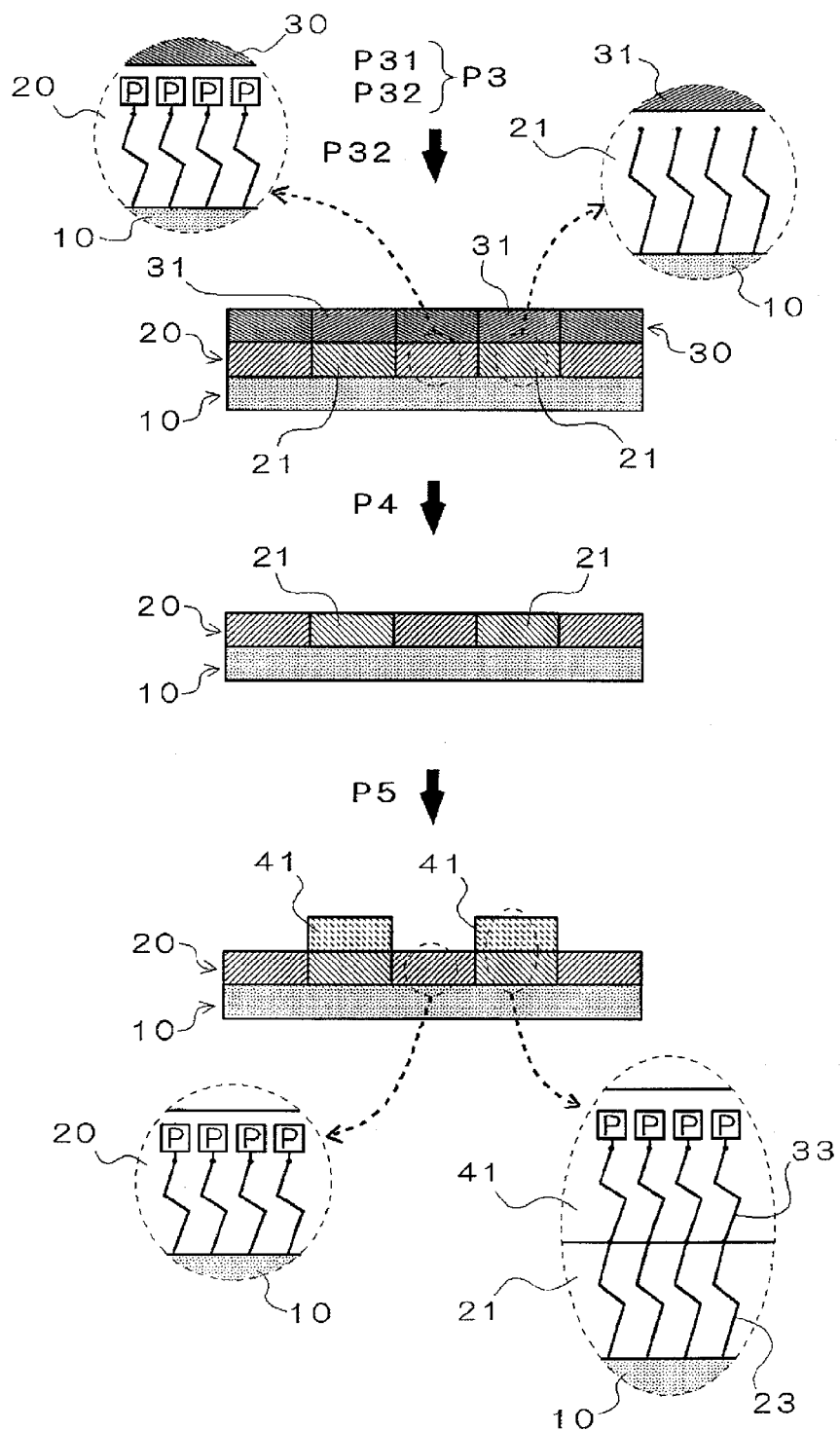
FIG. 2 is a view schematically illustrating a compound synthesis method according to one embodiment of the invention.

Embodiments of the invention provide the followings.

[1] A compound synthesis method including:

(P1) bonding a first compound that includes an acid-labile protecting group to a substrate to form a first film (hereinafter may be referred to as "first film-forming step");

(P2) forming a second film on the first film using an acid-transfer composition, the acid-transfer composition including (A) a polymer that includes a structural unit shown by the following formula (1) and a structural unit shown by the following formula (2), (B) a photoacid generator that is a compound shown by the following formula (3), and (C) a sensitizer that is a compound shown by the following formula (4) (hereinafter may be referred to as "second film-forming step");

(P3) exposing the second film to remove the protecting group from the first compound under the exposed area of the second film, and transferring an acid generated in the exposed area of the second film to the first film (hereinafter may be referred to as "protecting group-removing step");

(P4) removing the exposed second film (hereinafter may be referred to as "second film-removing step"); and (P5) bonding a second compound to the first compound from which the protecting group has been removed to synthesize a compound in which the first compound and the second compound are bonded (hereinafter may be referred to as "second compound-bonding step"),

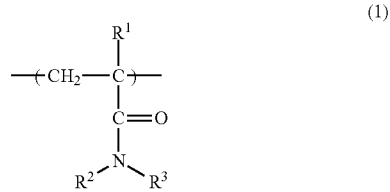

wherein R¹ represents a hydrogen atom or a methyl group, and R² and R³ individually represent a hydrogen atom, a linear or branched hydrocarbon group having 1 to 10 carbon atoms, or a cyclic hydrocarbon group having 3 to 10 carbon atoms, provided that R² and R³ may bond to form a 3 to 10-membered monocyclic hetero ring, or may bond via at least one hetero atom selected from a nitrogen atom, an oxygen atom, a sulfur atom, and a selenium atom to form a 4 to 10-membered monocyclic hetero ring,

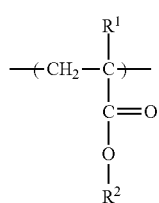

wherein $R^1$ represents a hydrogen atom or a methyl group, and $R^2$ represents a monovalent organic group,

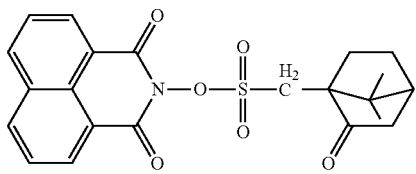

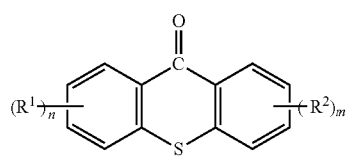

wherein $R^1$ and $R^2$ individually represent an alkyl group or a halogen atom, and n and m are individually an integer from 1 to 4.

[2] The compound synthesis method according to [1], wherein the content of the photoacid generator (B) in the acid-transfer composition is 30 to 200 parts by mass based on 100 parts by mass of the polymer (A).

[3] The compound synthesis method according to [1] or [2], wherein the substrate is formed of silicon, silicon dioxide, glass, polypropylene, or polyacrylamide.

[4] The compound synthesis method according to [1] or [2], wherein the first film-forming step (P1) includes bonding the first compound indirectly to the substrate.

[5] The compound synthesis method according to [1] or [2], wherein the compound in which the first compound and the second compound are bonded is a probe included in a biochip.

[6] The compound synthesis method according to [5], wherein the second compound is (1) a compound selected from the group consisting of nucleotides, amino acids, and monosaccharides, or (2) a conjugate of two or more compounds selected from the group consisting of nucleotides, amino acids, and monosaccharides.

[7] A microarray produced by the compound synthesis method according to [1].

[8] An acid-transfer composition including (A) a polymer that includes a structural unit shown by the following formula (1) and a structural unit shown by the following formula (2), (B) a photoacid generator that is a compound shown by the following formula (3), and (C) a sensitizer that is a compound shown by the following formula (4), the acid-transfer composition being used for a compound synthesis method including:

(P1) bonding a first compound that includes an acid-labile protecting group to a substrate to form a first film (hereinafter may be referred to as "first film-forming step");

(P2) forming a second film on the first film using an acid-transfer composition, the acid-transfer composition including (A) a polymer that includes a structural unit shown by the following formula (1) and a structural unit shown by the following formula (2), (B) a photoacid generator that is a compound shown by the following formula (3), and (C) a sensitizer that is a compound shown by the following formula (4) (hereinafter may be referred to as "second film-forming step");

(P3) exposing the second film to remove the protecting group from the first compound under the exposed area of the second film, and transferring an acid generated in the exposed area of the second film to the first film (hereinafter may be referred to as "protecting group-removing step");

(P4) removing the exposed second film (hereinafter may be referred to as "second film-removing step"); and (P5) bonding a second compound to the first compound from which the protecting group has been removed to synthesize a compound in which the first compound and the second compound are bonded (hereinafter may be referred to as "second compound-bonding step"),

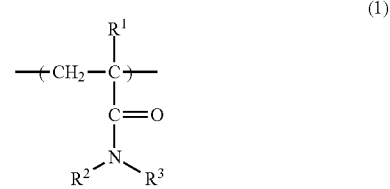

wherein $R^1$ represents a hydrogen atom or a methyl group, and $R^2$ and $R^3$ individually represent a hydrogen atom, a linear or branched hydrocarbon group having 1 to 10 carbon atoms, or a cyclic hydrocarbon group having 3 to 10 carbon atoms, provided that $R^2$ and $R^3$ may bond to form a 3 to 10-membered monocyclic hetero ring, or may bond via at least one atom selected from a nitrogen atom, an oxygen atom, a sulfur atom, and a selenium atom to form a 4 to 10-membered monocyclic hetero ring,

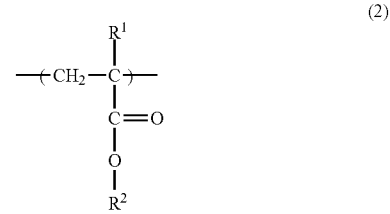

wherein $R^1$ represents a hydrogen atom or a methyl group, and $R^2$ represents a monovalent organic group,

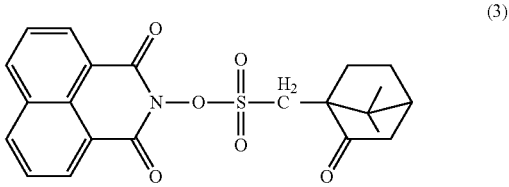

(4)

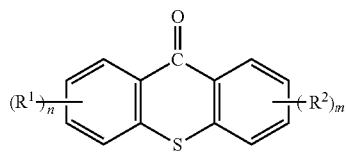

wherein R¹ and R² individually represent an alkyl group or a halogen atom, and n and m are individually an integer from 1 to 4.

[9] The acid-transfer composition according to [8], wherein the content of the photoacid generator (B) in the acid-transfer composition is 30 to 200 parts by mass based on 100 parts by mass of the polymer (A).

[10] The acid-transfer composition according to [8] or [9], wherein the substrate is formed of silicon, silicon dioxide, glass, polypropylene, or polyacrylamide.

[11] The acid-transfer composition according to [8] or [9], wherein the first film-forming step (P1) includes bonding the first compound indirectly to the substrate.

[12] A biochip composition including (A) a polymer that includes a structural unit shown by the following formula (1) and a structural unit shown by the following formula (2), (B) a photoacid generator that is a compound shown by the following formula (3), and (C) a sensitizer that is a compound shown by the following formula (4), (1)

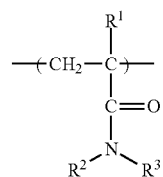

wherein R¹ represents a hydrogen atom or a methyl group, and R² and R³ individually represent a hydrogen atom, a linear or branched hydrocarbon group having 1 to 10 carbon atoms, or a cyclic hydrocarbon group having 3 to 10 carbon atoms, provided that R² and R³ may bond to form a 3 to 10-membered monocyclic hetero ring, or may bond via at least one hetero atom selected from a nitrogen atom, an oxygen atom, a sulfur atom, and a selenium atom to form a 4 to 10-membered monocyclic hetero ring, (2)

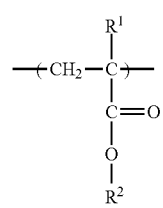

wherein R¹ represents a hydrogen atom or a methyl group, and R² represents a monovalent organic group, (3)

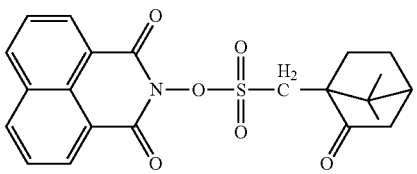

(4)

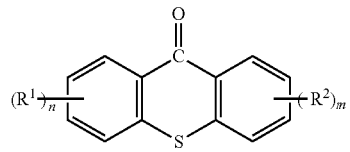

wherein R¹ and R² individually represent an alkyl group or a halogen atom, and n and m are individually an integer from 1 to 4.

According to the above compound synthesis method, a compound can be accurately and precisely synthesized on a substrate using the acid-transfer film (i.e., the second film formed by the step P2; hereinafter the same) that exhibits improved exposure sensitivity and an improved acid-transfer capability.

When the content of the photoacid generator (B) is 30 to 200 parts by mass based on 100 parts by mass of the polymer (A), more excellent acid-transfer selectivity can be obtained.

When the substrate is formed of silicon, silicon dioxide, glass, polypropylene, or polyacrylamide, the compound can be more accurately and precisely formed.

When the first film-forming step (P1) bonds the first compound indirectly to the substrate, various functions can be provided between the substrate and the first compound.

When the compound in which the first compound and the second compound are bonded is a probe included in a biochip, a biochip useful for the pharmaceutical field can be obtained.

When the second compound is (1) a compound selected from the group consisting of nucleotides, amino acids, and monosaccharides, or (2) a conjugate of two or more compounds selected from the group consisting of nucleotides, amino acids, and monosaccharides, a biochip useful for the pharmaceutical field can be obtained.

According to the above microarray, a compound can be accurately and precisely synthesized (disposed) on a substrate using the acid-transfer film that exhibits improved exposure sensitivity and an improved acid-transfer capability.

According to the above acid-transfer composition used for the above compound synthesis method, an acid-transfer film that exhibits improved exposure sensitivity and an improved acid-transfer capability can be formed, so that a compound can be accurately and precisely synthesized on a substrate.

When the content of the photoacid generator (B) is 30 to 200 parts by mass based on 100 parts by mass of the polymer (A), more excellent acid-transfer selectivity can be obtained.

When the substrate is formed of silicon, silicon dioxide, glass, polypropylene, or polyacrylamide, the compound can be more accurately and precisely formed.

When the first film-forming step (P1) bonds the first compound indirectly to the substrate, various functions can be provided between the substrate and the first compound.

According to the above biochip composition, an acid-transfer film that exhibits improved exposure sensitivity and an improved acid-transfer capability can be formed, so that a compound can be accurately and precisely synthesized on a substrate.

The embodiments will now be described with reference to the accompanying drawings, wherein like reference numerals designate corresponding or identical elements throughout the various drawings. Note that the term "(meth)acryl" used herein refers to acryl or methacryl, and the term "(meth)acrylate" used herein refers to an acrylate or a methacrylate.

[1] Compound Synthesis Method

A compound synthesis method according to one embodiment of the invention includes (P1) a first film-forming step, (P2) a second film-forming step, (P3) a protecting group-removing step, (P4) a second film-removing step, and (P5) a second compound-bonding step, and synthesizes a compound in which a first compound and a second compound are bonded.

The first film-forming step (P1) (see P1 in FIG. 1) includes bonding a first compound that includes an acid-labile protecting group P to a substrate 10 to form a first film 20.

The first compound includes the acid-labile protecting group P (hereinafter may be referred to as "protecting group"). The first compound is not particularly limited insofar as the first compound includes the protecting group P. Examples of the first compound include the following compounds (1) to (3).

(1) A coupling compound for bonding the surface of the substrate and a second compound. Specific examples of the coupling compound include a compound that has a bonding hand bonded to the second compound protected with a protecting group and a bonding hand bonded to the surface of the substrate (e.g., a compound that includes a protecting group and a silyl group).

(2) A protecting group-introducing compound for introducing a protecting group. Specific examples of the protecting group-introducing compound include a compound for introducing a protecting group that protects an amino group or a hydroxyl group (e.g., a compound that includes a protecting group and a group that can be bonded to an amino group via a peptide bond).

(3) A spacer compound that separates the second compound from the surface of the substrate (e.g., a compound that includes a protecting group and a group that can be bonded to an amino group spaced by an alkyl chain via a peptide bond).

The coupling compound (1) is normally bonded directly to the surface of the substrate, but may be bonded indirectly to the surface of the substrate via another compound. The protecting group-introducing compound (2) and the spacer compound (3) are normally bonded indirectly to the surface of the substrate via another compound. The protecting group-introducing compound (2) and the spacer compound (3) may be bonded indirectly to the surface of the substrate via an arbitrary compound such as a coupling agent (coupling compound).

Examples of the protecting group-introducing compound (2) include aminoalkylcarboxylic acids (e.g., ω-aminocaproic acid compounds) and the like. Specific examples of the protecting group-introducing compound (2) include carboxylic acid derivatives that include a t-butoxycarbonyl group as a protecting group, such as 6-N-t-butoxycarbonylaminocaproic acid, 4-N-t-butoxycarbonylaminobutanoic acid, 5-N-t-butoxycarbonylaminopentanoic acid, and 7-N-t-butoxycarbonylaminoheptanoic acid, and the like.

Examples of the coupling agent (coupling compound) that bonds the substrate and the first compound (protecting group-introducing compound) when using the protecting group-introducing compound (2) as the first compound include a coupling agent that includes an amino group and a silyl group (e.g., aminopropyltriethoxysilane), and a coupling agent that includes a hydroxyl group and a silyl group.

A compound that includes a protecting group among compounds mentioned later as the second compound, a derivative obtained by introducing a protecting group into a compound mentioned later as the second compound, or the like may also be used as the first compound.

The term "acid-labile protecting group (P)" used herein refers to a group (acidic group) that dissociates in the presence of an acid, and substitutes a hydrogen atom included in an acidic group such as a phenolic hydroxyl group, a carboxyl group, a sulfonic acid group, a phosphoric acid group, or an acidic hydroxyl group. Examples of the group (P) include a t-butoxycarbonyl group, a tetrahydropyranyl group, a tetrahydrofuranyl group, a (thiotetrahydropyranylsulfanyl)methyl group, a (thiotetrahydrofuranylsulfanyl)methyl group, an alkoxy-substituted methyl group, an alkylsulfanyl-substituted methyl group, an acetal group, a hemiacetal group, a group shown by the following formula (5) (hereinafter may be referred to as "acid-dissociable group (P)"), and the like.

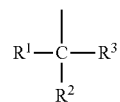

(5)

wherein $R^1$ to $R^3$ individually represent a linear alkyl group having 1 to 14 carbon atoms, a branched alkyl group having 1 to 14 carbon atoms, a non-bridged monovalent alicyclic hydrocarbon group having 3 to 20 carbon atoms, a bridged monovalent alicyclic hydrocarbon group having 3 to 20 carbon atoms, or a monovalent aromatic group having 6 to 20 carbon atoms, provided that two of $R^1$ to $R^3$ may bond to form a non-bridged divalent alicyclic hydrocarbon group having 3 to 20 carbon atoms or a bridged divalent alicyclic hydrocarbon group having 3 to 20 carbon atoms, and the remainder of $R^1$ to $R^3$ may represent a linear alkyl group having 1 to 14 carbon atoms, a branched alkyl group having 1 to 14 carbon atoms, a non-bridged monovalent alicyclic hydrocarbon group having 3 to 20 carbon atoms, a bridged monovalent alicyclic hydrocarbon group having 3 to 20 carbon atoms, or a monovalent aromatic group having 6 to 20 carbon atoms (each of these groups may be substituted or unsubstituted).

Examples of the linear or branched alkyl group having 1 to 14 carbon atoms represented by $R^1$ to $R^3$ in the formula (5) include a methyl group, an ethyl group, an n-propyl group, an i-propyl group, an n-butyl group, a 2-methylpropyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, and the like.

Examples of the non-bridged or bridged monovalent alicyclic hydrocarbon group having 3 to 20 carbon atoms represented by $R^1$ to $R^3$ in the formula (5) include cycloalkyl groups such as a cyclopropyl group, a cyclobutyl group, a cyclopentyl group, a cyclohexyl group, a cycloheptyl group, and a cyclooctyl group, a bicyclo[2.2.1]heptyl group, a bicyclo[2.2.2]octyl group, a tetracyclo[4.2.0.1$^{2,5}$.1$^{7,10}$]dodecyl group, an adamantyl group, and the like.

Examples of the monovalent aromatic group having 6 to 20 carbon atoms represented by $R^1$ to $R^3$ in the formula (5) include a phenyl group, a naphthyl group, an anthracenyl group, and the like.

$R^1$ to $R^3$ in the formula (5) may individually be substituted. Examples of the substituent include a hydroxyl group, a carboxyl group, an oxo group (=O), a cyano group, a halogen atom (e.g., fluorine atom and chlorine atom), linear alkyl groups having 1 to 14 carbon atoms (e.g., methyl group, ethyl group, n-propyl group, and n-butyl group), branched alkyl groups having 1 to 14 carbon atoms (e.g., i-propyl group, 2-methylpropyl group, 1-methylpropyl group, and t-butyl group), linear alkoxy groups having 1 to 8 carbon atoms (e.g., methoxy group, ethoxy group, n-propoxy group, and n-butoxy group), branched alkoxy groups having 1 to 8 carbon atoms (e.g., i-propoxy group, 2-methylpropoxy group, 1-methylpropoxy group, and t-butoxy group), linear alkoxyalkyl groups having 2 to 8 carbon atoms (e.g., methoxymethyl group and ethoxymethyl group), branched alkoxyalkyl groups having 2 to 8 carbon atoms (e.g., t-butoxymethyl group), linear alkoxyalkoxy groups having 2 to 8 carbon atoms (e.g., methoxymethoxy group and ethoxy methoxy group), branched alkoxyalkoxy groups having 2 to 8 carbon atoms (e.g., t-butoxymethoxy group), linear alkylcarbonyloxy groups having 2 to 8 carbon atoms (e.g., methylcarbonyloxy group and ethylcarbonyloxy group), branched alkylcarbonyloxy groups having 2 to 8 carbon atoms (e.g., t-butylcarbonyloxy group), linear alkoxycarbonyl groups having 2 to 8 carbon atoms (e.g., methoxycarbonyl group and ethoxycarbonyl group), branched alkoxycarbonyl groups having 2 to 8 carbon atoms (e.g., t-butoxycarbonyl group), linear cyanoalkyl groups having 2 to 14 carbon atoms (e.g., cyanomethyl group, 2-cyanoethyl group, 3-cyanopropyl group, 4-cyanobutyl group), branched cyanoalkyl groups having 2 to 14 carbon atoms, linear fluoroalkyl groups having 1 to 14 carbon atoms (e.g., fluoromethyl group, trifluoromethyl group, and pentafluoroethyl group), branched fluoroalkyl groups having 1 to 14 carbon atoms, and the like. These groups may be used either individually or in combination.

Examples of the alkoxy-substituted methyl group include a methoxymethyl group, an ethoxymethyl group, a methoxyethoxymethyl group, an n-propoxymethyl group, an n-butoxymethyl group, an n-pentyloxymethyl group, an n-hexyloxymethyl group, a benzyloxymethyl group, and the like.

Examples of the alkylsulfanyl-substituted methyl group include a methylsulfanylmethyl group, an ethylsulfanylmethyl group, a methoxyethylsulfanylmethyl group, an n-propylsulfanylmethyl group, an n-butylsulfanylmethyl group, an n-pentylsulfanylmethyl group, an n-hexylsulfanylmethyl group, a benzylsulfanylmethyl group, and the like.

Specific examples of the acid-dissociable group (P) include a group shown by the following formula (6).

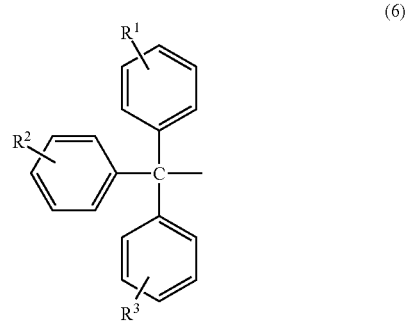

(6)

wherein $R^1$ to $R^3$ individually represent a hydrogen atom, a halogen atom, a hydroxyl group, a carboxyl group, an oxo group (=O), a cyano group, a linear or branched alkyl group having 1 to 14 carbon atoms, a linear or branched alkoxy group having 1 to 8 carbon atoms, a linear or branched alkoxyalkyl group having 2 to 8 carbon atoms, a linear or branched alkoxyalkoxy group having 2 to 8 carbon atoms, a linear or branched alkylcarbonyloxy group having 2 to 8 carbon atoms, a linear or branched alkylcarbonyl group having 2 to 8 carbon atoms, a linear or branched cyanoalkyl group having 2 to 14 carbon atoms, or a linear or branched fluoroalkyl group having 1 to 14 carbon atoms.

The description that has been given in connection with the acid-dissociable group (P) may be applied to $R^1$ to $R^3$ in the formula (6).

Examples of the alkoxy-substituted methyl group include a methoxymethyl group, an ethoxymethyl group, a methoxyethoxymethyl group, an n-propoxymethyl group, an n-butoxymethyl group, an n-pentyloxymethyl group, an n-hexyloxymethyl group, a benzyloxymethyl group, and the like.

Examples of the alkylsulfanyl-substituted methyl group include a methylsulfanylmethyl group, an ethylsulfanylmethyl group, a methoxyethylsulfanylmethyl group, an n-propylsulfanylmethyl group, an n-butylsulfanylmethyl group, an n-pentylsulfanylmethyl group, an n-hexylsulfanylmethyl group, a benzylsulfanylmethyl group, and the like.

It is preferable that the acid-dissociable group (P) be bonded to an oxygen atom in the first compound. Specifically, the first compound preferably includes an oxygen atom, and the acid-dissociable group (P) bonded to (via) the oxygen atom. In this case, the acid-dissociable group (P) can be smoothly removed from the first compound or the like due to an acid generated from an acid-transfer film (second film).

The type of the substrate 10 is not particularly limited. The substrate may be formed of an inorganic material, an organic material, or an inorganic-organic composite material. The upper (one) surface and the lower (other) surface of the substrate 10 may be formed of different materials. Examples of the material for the substrate include silicon, silicon dioxide, and inorganic materials including silicon as the main component, such as glass (including borosilicate glass, surface-modified glass, quartz glass, and the like). Further examples of the material for the substrate include organic materials such as polypropylene and polyacrylamide (including polyacrylamide that is surface-activated by acrylamide). A substrate having a surface that includes a reactive site (e.g., active amino group) suitable for immobilizing a layer (may be other than the first film) of a compound that includes a protecting group may also be appropriately used.

The first film 20 may be bonded to the substrate 10 by an arbitrary method. The first film 20 is normally bonded to the substrate 10 by applying a liquid that includes the first compound to the surface of the substrate 10 (the substrate 10 may or may not be surface-treated) so that the first compound reacts with the surface of the substrate 10. The liquid may be applied by an arbitrary method (e.g., spin coating, cast coating, roll coating, spray coating, or printing (e.g., doctor blade coating)).

The substrate is preferably washed with a washing solution (e.g., alkaline ethanol aqueous solution), and dried before use.

The first compound may be bonded to the substrate 10 either directly or indirectly via another compound. Specifically, the first film 20 (i.e., a film formed of a plurality of aligned first compounds or a residue thereof) may be stacked directly on the substrate 10, or may be stacked indirectly on the substrate 10 via one or more films.

The first compound is bonded to the substrate 10 either directly or indirectly in a state in which the protecting group is maintained. Part of the structure of the first compound may or may not change when the first compound is bonded to the substrate 10. For example, a bonding hand formed due to elimination of part of the structure of the first compound may be utilized.

The second film-forming step (P2) (see P2 in FIG. 1) includes forming a second film 30 on the first film 20 using an acid-transfer composition that includes (A) a polymer, (B) a photoacid generator, and (C) a sensitizer.

The details of the acid-transfer composition, the polymer (A), the photoacid generator (B), and the sensitizer (C) are described later.

The second film is formed using the acid-transfer composition, and normally includes the polymer (A) included in the acid-transfer composition and/or a cured product of the polymer (A), for example. The cured product of the polymer (A) may be a polymer in which the polymer (A) is bonded to another monomer, oligomer, or the like, a polymer in which the polymers (A) are bonded, or the like. These cured products may be used either individually or in combination.

The second film may be formed by an arbitrary method. For example, the second film may be formed by applying the acid-transfer composition that includes a solvent, and removing part or all of the solvent. The acid-transfer composition may be applied by an arbitrary method (e.g., spin coating, cast coating, roll coating, or printing). These methods may be used either individually or in combination. The solvent may be removed by an arbitrary method (e.g., heating, removal under reduced pressure, or spontaneous evaporation). These methods may be used either individually or in combination.

After applying the acid-transfer composition, the solvent may be volatilized by prebaking (PB) to form the second film 30. The prebaking temperature is appropriately selected depending on the composition of the acid-transfer composition, but is normally about 30 to 150° C., and preferably 50 to 130° C. The prebaking time is normally 30 to 300 seconds, and preferably 60 to 180 seconds.

The thickness of the second film 30 is not particularly limited, but is normally 1 to 10000 nm, preferably 5 to 800 nm, and more preferably 10 to 500 nm.

The protecting group-removing step (P3) (including P31 and P32 in FIGS. 1 and 2) includes exposing the second film to remove the protecting group from the first compound under the exposed area of the second film, and transferring an acid generated in the exposed area of the second film to the first film. As shown in FIGS. 1 and 2, the protecting group-removing step (P3) includes an exposure step P31 that exposes the second film 30 to radiation, and an acid-transfer step P32 that transfers (diffuses) an acid generated in the second film 30 upon exposure to the first film 20.

The exposure step P31 exposes the second film 30 via a mask 50 so that an acid is generated in the second film 30. As shown in FIG. 1, the exposed area of the second film 30 thus forms an acid-generating area 31.

The mask 50 is preferably a mask on which a given pattern is drawn, for example. Note that the second film 30 may be exposed using a micromirror instead of using a mask. A specific example of the exposure method is disclosed in U.S. Pat. No. 6,426,184, for example.

The type of radiation used for exposure is not particularly limited. Radiation used for exposure is appropriately selected depending on the properties of the second film 30 (e.g., the type of the acid generator included in the second film 30). The dose and the like are also appropriately selected depending on the properties of the second film 30 (e.g., the type of the acid generator included in the second film 30).

The acid-transfer step P32 transfers an acid generated in the second film 30 to the first film 20. As shown in FIG. 2, when the protecting group P is removed from the first compound that forms the first film 20 corresponding to the acid-generating area 31, part of the first film 20 forms an acid-transfer area 21 that includes a residue of the first compound from which the protecting group P has dissociated.

The acid may be transferred by an arbitrary method. For example, the acid may be transferred by (1) heating the film, (2) allowing the film to stand at room temperature, or (3) utilizing an osmotic pressure. These methods may be used either individually or in combination. Note that it is preferable to transfer the acid by heating the film ((1)) since an excellent transfer efficiency is achieved.

In this case, the heating temperature is not particularly limited, but is preferably 50 to 200° C., and more preferably 70 to 150° C. The heating time is preferably 30 to 300 seconds, and more preferably 60 to 180 seconds.

When transferring the acid by heating the film, the film may be heated two or more times so that the same result as that under the above heating conditions is obtained.

Note that the method (2) (i.e., allowing the film to stand at room temperature) refers to a method in which the acid generated in the second film 30 is allowed to diffuse into the first film 20 spontaneously by allowing the film to stand at room temperature (normally 20 to 30° C.).

The second film-removing step (P4) (see P4 in FIG. 2) includes removing the exposed second film 20. Specifically, the first film 20 under the second film 30 to which the acid has been transferred is exposed by removing the second film 30.

The second film 30 may be removed by an arbitrary method. The second film 30 is normally removed by dissolving the second film 30 using an organic solvent. The organic solvent dissolves the second film 30, but does not dissolve the first film 20 to which the acid has been transferred.

The organic solvent is appropriately selected depending on each component of the second film 30 and the first film 20. Specific examples of the organic solvent include acetonitrile, acetone, tetrahydrofuran, pyridine, and the like. These organic solvents may be used either individually or in combination.

The second compound-bonding step (P5) (see P5 in FIG. 2) includes bonding a second compound to the first compound from which the protecting group has been removed. Specifically, a part 41 including the second compound is stacked on the acid-transfer area 21 of the first film 20 to which the acid has been transferred and from which the protecting group P has dissociated.

The second compound is not particularly limited. Various compounds may be used as the second compound. Examples of the second compound include (1) nucleotides (e.g., nucleotides, deoxynucleotide, and analogs (e.g., synthetic nucleotide analogs and synthetic deoxynucleotide analogs)), (2) amino acids, (3) monosaccharides, (4) a conjugate of two or more compounds selected from these nucleotides, amino acids, and monosaccharides, (5) peptide nucleic acid-forming compounds (peptide nucleic acid monomers) for synthesizing peptide nucleic acid (PNA), (6) end-forming compounds, and the like. These second compounds may include a protecting group and an active group. These second compounds may be used either individually or in combination.

Examples of the nucleotides (1) include deoxynucleotides and synthetic nucleotide analogs.

Examples of the nucleotides include adenosine phosphate, guanosine phosphate, cytidine phosphate, uridine phosphate, and the like.

Examples of the deoxynucleotides include deoxyadenosine phosphate, deoxyguanosine phosphate, deoxycytidine phosphate, deoxythymidine phosphate, and the like.

Examples of the synthetic nucleotide analogs include crosslinked nucleotide analogs such as a 2'-4'-crosslinked nucleotide analog, a 3'-4'-crosslinked nucleotide analog, and a 5'-amino-3',5'-crosslinked nucleotide analog, and the like.

Examples of activated nucleotides include phosphoramidite nucleotide molecules and the like.

Examples of the amino acids (2) (including L-amino acids and D-amino acids) include glycine, alanine, valine, leucine, and isoleucine having an alkyl chain, serine and threonine having a hydroxyl group, cysteine and methionine including sulfur, asparagine and glutamine having an amide group, proline having an imino group, phenylalanine, tyrosine, and tryptophan having an aromatic group, and the like.

Examples of the monosaccharides (3) include glucose, galactose, mannose, fucose, xylose, N-acetylglucosamine, N-acetylgalactosamine, and the like.

Examples of the conjugate (4) include oligonucleotides (i.e., a conjugate of nucleotides), peptides (i.e., a conjugate of amino acids), proteins (i.e., a conjugate of amino acids), and the like.

Examples of the peptide nucleic acid-forming compounds include N-(2-t-butyloxycarbonyl-aminoethyl)-N-thymin-1-ylacetyl)glycine, N—(N-4-(benzyloxycarbonyl)cytosin-1-yl)acetyl-N-(2-t-butyloxycarbonyl-aminoethyl)glycine, N—(N-6-(benzyloxycarbonyl)adenin-9-yl)acetyl-N-(2-t-butyloxycarbonyl-aminoethyl)glycine, N—(N-4-(benzyloxycarbonyl)guanin-1-yl)acetyl-N-(2-t-butyloxycarbonyl-aminoethyl)glycine, and the like.

The end-forming compounds (6) refer to compounds that form the end of a molecular chain, and include protecting group-forming compounds that include a protecting group, capping compounds, labeling compounds, and the like. Examples of the labeling compounds include fluorescent labeling compounds (e.g., fluorescein derivatives such as fluorescein isothiocyanate) and radioactive isotope labeling compounds.

Examples of the protecting group that may be included in the second compound include the acid-dissociable group (P) mentioned above in connection with the first compound, and a light-labile protecting group.

Examples of the active group that may be included in the second compound include phosphorus-containing groups that may react with a free hydroxyl group, such as a phosphoramidite group, an H-phosphonate group, a phosphodiester group, a phosphotriester group, and a trialkyl phosphate group. Examples of the activated nucleotides include phosphoramidite nucleotide molecules and the like. Examples of a photochemically active group and a thermochemically active group include an amino group, a thiol group, a maleimide group, an N-hydroxysuccinimidyl ester group, a formyl group, a carboxyl group, an acrylamide group, an epoxy group, and the like.

Note that the second compound and the bonding process are not limited thereto. Various compounds and bonding processes may be employed depending on the target compound. For example, the compounds and the methods disclosed in Fordor et al., Science, 251, p. 767 (1991) may be used.

Figure 3:
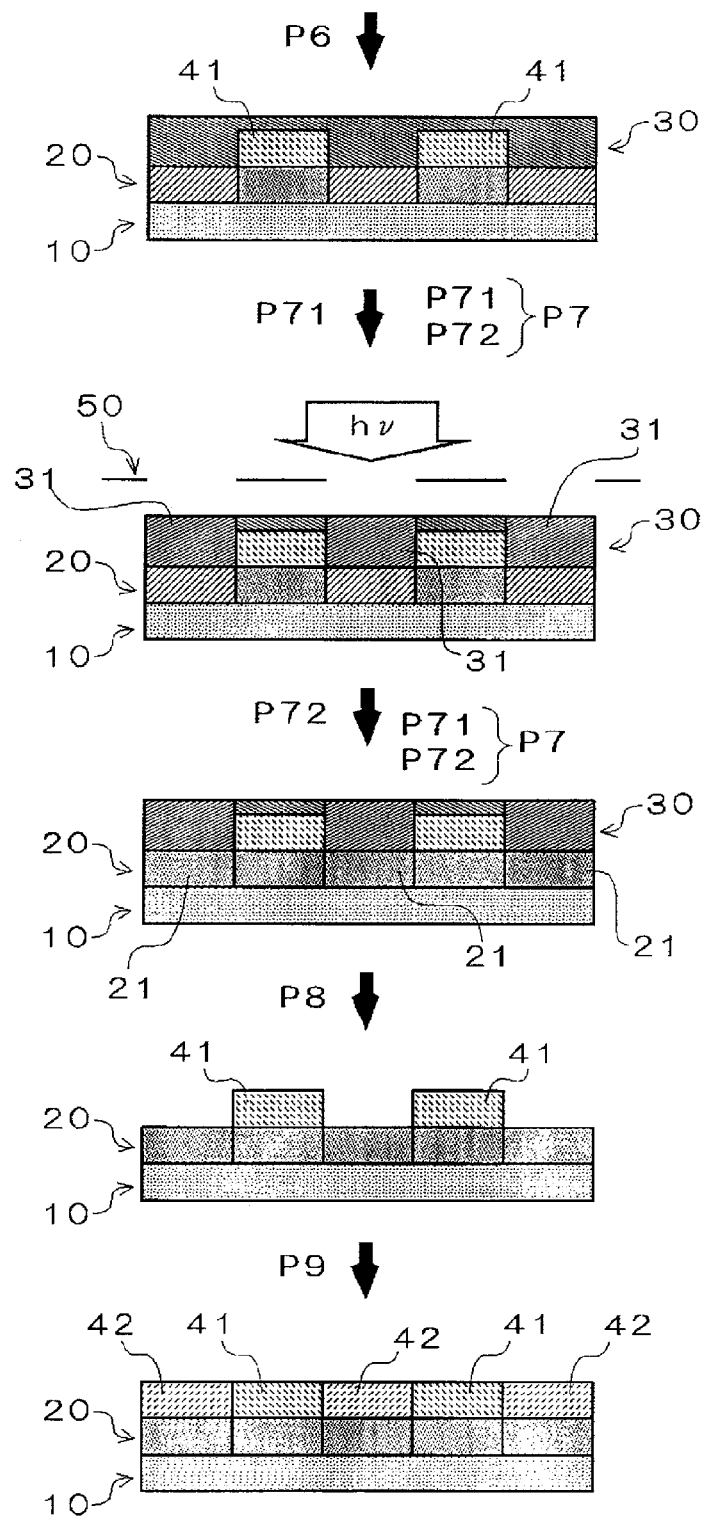
FIG. 3 is a view schematically illustrating a compound synthesis method according to one embodiment of the invention.

As shown in FIG. 3, the protecting group P is dissociated from the first film in which the protecting group remains (i.e., an area to which the second compound is not bonded) by performing the same operation as the operation that dissociates the protecting group P from the first film (third film (acid-transfer film) formation step P6, protecting group-removing step P7 (exposure step P71 and acid-transfer step P72), and third film-removing step P8), and a third compound is bonded to the residue of the first compound by performing a third compound bonding step P9 to form a part 42 that is formed of the residue of the third compound.

As shown in FIG. 2 (bottom), when the second compound includes the acid-labile protecting group P, another compound (e.g., fourth compound or fifth compound) can be bonded to the part 41 that is formed of the residue of the second compound by performing the same operation as described above. A compound (e.g., polymer) can be synthesized on the substrate with a high degree of freedom by repeating the above operation.

Specifically, the compound synthesis method according to one embodiment of the invention includes at least the steps (P1) to (P5) as one cycle. This cycle may be repeated a plurality of times so that the desired number (e.g., the number of probes) of compounds or a compound having the desired length (e.g., the degree of polymerization) can be obtained. After the desired compound has been obtained (e.g., has been synthesized in an array configuration), the acid-dissociable groups (P) that remain in the compound may be removed.

The description that has been given above in connection with the second compound may be applied to the third compound, the fourth compound, and the fifth compound. The first compound, the second compound, the third compound, the fourth compound, the fifth compound, and the like may be either the same or different.

A compound in which the first compound and the second compound are bonded can be obtained by the compound synthesis method according to one embodiment of the invention. The compound obtained by the compound synthesis method according to one embodiment of the invention may be a compound in which only the first compound (or a residue of the first compound obtained when the first compound is bonded to the second compound) and the second compound (or a residue of the second compound obtained when the second compound is bonded to the first compound) are bonded, or may be a compound that includes the first compound and the second compound as part of a polymer compound.

The compound synthesis method according to one embodiment of the invention makes it possible to design a compound (e.g., polymer) formed on a substrate with a high degree of freedom. The compound (e.g., polymer) synthesized by compound synthesis method according to one embodiment of the invention is not particularly limited. The compound synthesis method according to one embodiment of the invention is particularly suitable for synthesizing a biopolymer and a pseudo-biopolymer. The biopolymer and the pseudo-biopolymer synthesized by the compound synthesis method according to one embodiment of the invention may be used as a probe included in a biochip. Specifically, the probe included in the biochip may be a biopolymer or a pseudo-biopolymer.

Specific examples of the compound synthesized by compound synthesis method according to one embodiment of the invention include nucleic acid and proteins. Examples of the nucleic acid include DNA, RNA, peptide nucleic acid (PNA), and artificial nucleic acid synthesized using a crosslinked nucleotide analog (e.g., Locked Nucleic Acid (LNA) (trademark of Proligo LLC) and BNA).

DNA and RNA have a phosphate bond skeleton, and PNA is a pseudo-biopolymer that has a peptide bond skeleton. The PNA is normally a compound that includes an aminoethylglycine derivative as a monomer. Specifically, the PNA includes a nucleic acid analog that has a skeleton formed of an N-(2-aminoethyl)-glycine repeating unit, wherein a base is linked to the skeleton via a methylene-carbonyl bond. Examples of the PNA include N-(2-t-butyloxycarbonyl-aminoethyl)-N-thymin-1-ylacetyl)glycine, N—(N-4-(benzyloxycarbonyl)cytosin-1-yl)acetyl-N-(2-t-butyloxycarbonyl-aminoethyl)glycine, N—(N-6-(benzyloxycarbonyl)adenin- 9-yl)acetyl-N-(2-t-butyloxycarbonyl-aminoethyl)glycine, N—(N-4-(benzyloxycarbonyl)guanin-1-yl)acetyl-N-(2-t-butyloxycarbonyl-aminoethyl)glycine, and the like. These compounds may be used either individually or in combination.

The acid-transfer composition includes the polymer (A), the photoacid generator (B), and the sensitizer (C). The photoacid generator (B) may be referred to as "acid generator (B)".

The polymer (A) includes a structural unit shown by the following formula (1) (hereinafter may be referred to as "structural unit (A1)"), and a structural unit shown by the following formula (2) (hereinafter may be referred to as "structural unit (A2)").

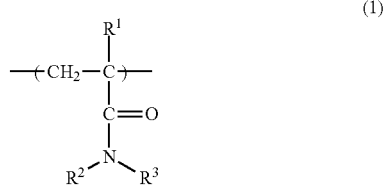

(1)

wherein $R^1$ represents a hydrogen atom or a methyl group, and $R^2$ and $R^3$ individually represent a hydrogen atom, a linear or branched hydrocarbon group having 1 to 10 carbon atoms, or a cyclic hydrocarbon group having 3 to 10 carbon atoms, provided that $R^2$ and $R^3$ may bond to form a 3 to 10-membered monocyclic hetero ring, or may bond via at least one hetero atom selected from a nitrogen atom, an oxygen atom, a sulfur atom, and a selenium atom to form a 4 to 10-membered monocyclic hetero ring.

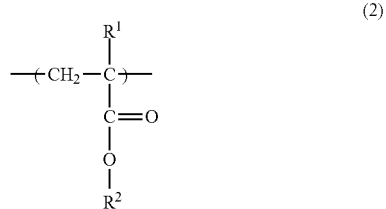

(2)

wherein $R^1$ represents a hydrogen atom or a methyl group, and $R^2$ represents a monovalent organic group.

If the polymer (A) includes the structural unit (A1), undesirable acid diffusion in the film formed using the acid-transfer composition can be prevented when the acid generator (B) has generated an acid. Specifically, the polymer (A) has an acid diffusion prevention function.

Examples of the linear or branched hydrocarbon group having 1 to 10 carbon atoms represented by $R^2$ and $R^3$ in the formula (1) include aliphatic hydrocarbon groups such as a methyl group, an ethyl group, an n-propyl group, an i-propyl group, an n-butyl group, a 2-methylpropyl group, a 1-methylpropyl group, and a t-butyl group.

Examples of the cyclic hydrocarbon group having 3 to 10 carbon atoms represented by $R^2$ and $R^3$ in the formula (1) include alicyclic groups such as a cyclobutyl group, a cyclopentyl group, a cyclohexyl group, a cycloheptyl group, and a cyclooctyl group, and aromatic groups such as a phenyl group, an o-tolyl group, an m-tolyl group, a p-tolyl group, a 4-t-butylphenyl group, a 1-naphthyl group, and a benzyl group.

When $R^2$ and $R^3$ in the formula (1) bond to form a 3 to 10-membered monocyclic hetero ring (the monocyclic hetero ring may be an unsaturated ring or a saturated ring), such a group may be an aziridino group, an azetino group, a pyrrolidino group, a pyrrole group, a piperidino group, a pyrridino group, or the like.

When $R^2$ and $R^3$ in the formula (1) bond via at least one hetero atom selected from a nitrogen atom, an oxygen atom, a sulfur atom, and a selenium atom to form a 4 to 10-membered monocyclic hetero ring (the monocyclic hetero ring may be an unsaturated ring or a saturated ring), the amine group may be a morpholino group, a thiomorpholino group, a selenomorpholino group, an iso-oxazolidino group, an isoxazole group, an isothiazolidino group, an isothiazole group, an imidazolidino group, a piperazino group, a triazino group, or the like.

The structural unit (A1) may normally be obtained by polymerizing the polymer (A) using a monomer (Am1) shown by the following formula (7).

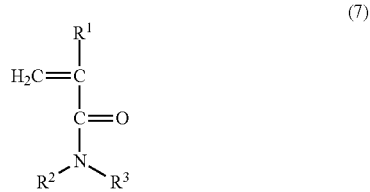

(7)

wherein $R^1$ represents a hydrogen atom or a methyl group, and $R^2$ and $R^3$ individually represent a hydrogen atom, a linear or branched hydrocarbon group having 1 to 10 carbon atoms, or a cyclic hydrocarbon group having 3 to 10 carbon atoms, provided that $R^2$ and $R^3$ may bond to form a 3 to 10-membered monocyclic hetero ring, or may bond via at least one hetero atom selected from a nitrogen atom, an oxygen atom, a sulfur atom, and a selenium atom to form a 4 to 10-membered monocyclic hetero ring.

The description given above in connection with the formula (1) may be applied to the linear or branched hydrocarbon group having 1 to 10 carbon atoms and the cyclic hydrocarbon group having 3 to 10 carbon atoms represented by $R^2$ and $R^3$ in the formula (7).

The description given above in connection with the formula (1) may be applied to the 3 to 10-membered monocyclic hetero ring formed by $R^2$ and $R^3$, and the 4 to 10-membered monocyclic hetero ring formed by $R^2$ and $R^3$ via at least one hetero atom selected from a nitrogen atom, an oxygen atom, a sulfur atom, and a selenium atom.

Examples of the monomer (Am1) in which $R^2$ and $R^3$ in the formula (7) represent a linear or branched hydrocarbon group having 1 to 10 carbon atoms include N,N-dimethyl(meth)acrylamide, N,N-diethyl(meth)acrylamide, N-isopropyl (meth)acrylamide, and the like. Examples of the monomer (Am1) in which $R^2$ and $R^3$ in the formula (7) bond via a hetero atom to form a 4 to 10-membered monocyclic hetero ring include N-(meth)acryloylmorpholine and the like.

As the monomer (Am1), N,N-dimethylacrylamide, N,N-dimethyl(meth)acrylamide, N-acryloylmorpholine, and N-methacryloylmorpholine are preferable. The polymer (A) obtained using such a preferable monomer (Am1) more effectively prevents undesirable acid diffusion in the film formed using the acid-transfer composition when the acid generator (B) has generated an acid.

The content of the structural unit (A1) in the polymer (A) is not particularly limited, but is preferably 1 to 50 mol %, more preferably 3 to 40 mol %, and particularly preferably 5 to 30 mol %, based on the total structural units (=100 mol %) of the polymer (A). If the content of the structural unit (A1) in the polymer (A) is within the above range, undesirable acid diffusion in the film formed using the acid-transfer composition can be more effectively prevented when the acid generator (B) has generated an acid.

Examples of the monovalent organic group represented by $R^2$ in the formula (2) include a linear or branched alkyl group having 1 to 12 carbon atoms, an aromatic hydrocarbon group having 6 to 20 carbon atoms, a hydroxyalkyl group having 1 to 8 carbon atoms, a nitrogen atom-containing organic group, a cyclic hydrocarbon group, an alicyclic group, and the like.

Examples of the linear or branched alkyl group having 1 to 12 carbon atoms represented by $R^2$ in the formula (2) include a methyl group, an ethyl group, an n-propyl group, an i-propyl group, an n-butyl group, a 2-methylpropyl group, a 1-methylpropyl group, a t-butyl group, and the like.

Examples of the aromatic hydrocarbon group having 6 to 20 carbon atoms represented by $R^2$ in the formula (2) include a phenyl group, an o-tolyl group, an m-tolyl group, a p-tolyl group, a 2,4-xylyl group, a 2,6-xylyl group, a 3,5-xylyl group, a mesityl group, an o-cumenyl group, an m-cumenyl group, a p-cumenyl group, a benzyl group, a phenethyl group, a 1-naphthyl group, a 2-naphthyl group, and the like.

Examples of the hydroxyalkyl group having 1 to 8 carbon atoms represented by $R^2$ in the formula (2) include a hydroxymethyl group, a 1-hydroxyethyl group, a 2-hydroxyethyl group, a 1-hydroxypropyl group, a 2-hydroxypropyl group, a 3-hydroxypropyl group, a 1-hydroxybutyl group, a 2-hydroxybutyl group, a 3-hydroxybutyl group, a 4-hydroxybutyl group, a 3-hydroxycyclopentyl group, a 4-hydroxycyclohexyl group, and the like.

Examples of the nitrogen atom-containing organic group represented by $R^2$ in the formula (2) include a cyano group having 2 to 9 carbon atoms, a cyanoalkyl group having 2 to 9 carbon atoms such as a cyanomethyl group, a 1-cyanoethyl group, a 2-cyanoethyl group, a 1-cyanopropyl group, a 2-cyanopropyl group, a 3-cyanopropyl group, a 1-cyanobutyl group, a 2-cyanobutyl group, a 3-cyanobutyl group, a 4-cyanobutyl group, a 3-cyanocyclopentyl group, and a 4-cyanocyclohexyl group, and the like.

Examples of the cyclic hydrocarbon group represented by $R^2$ in the formula (2) include a cyclopentyl group, a cyclohexyl group, and the like.

Examples of the alicyclic group represented by $R^2$ in the formula (2) include a bridged cyclic hydrocarbon group (e.g., bornyl group and isobornyl group), and the like.

Note that it is preferable that $R^2$ in the formula (2) does not represent the acid-dissociable group (P).

The polymer (A) that includes the structural unit (A2) may normally be obtained using a monomer (Am2) shown by the following formula (8).

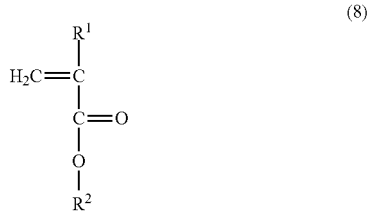

(8)

wherein $R^1$ represents a hydrogen atom or a methyl group, and $R^2$ represents a monovalent organic group.

The description given above in connection with the formula (2) may be applied to the monovalent organic group represented by $R^2$ in formula (8).

The monomer (Am2) is preferably a (meth)acrylate compound. Specific examples of the monomer (Am2) include methyl (meth)acrylate, ethyl (meth)acrylate, n-propyl (meth)acrylate, n-butyl (meth)acrylate, 2-hydroxyethyl (meth)acrylate, 2-hydroxypropyl (meth)acrylate, polyethylene glycol mono(meth)acrylate, polypropylene glycol mono(meth)acrylate, glycerol mono(meth)acrylate, phenyl (meth)acrylate, benzyl (meth)acrylate, cyclohexyl (meth)acrylate, isobornyl (meth)acrylate, tricyclodecanyl (meth)acrylate, and the like. These (meth)acrylate compounds may be used either individually or in combination. Methyl methacrylate is particularly preferable as the (meth)acrylate compound.

The content of the structural unit (A2) in the polymer (A) is not particularly limited, but is preferably 5 to 99 mol %, more preferably 10 to 97 mol %, and particularly preferably 15 to 95 mol %, based on the total structural units (=100 mol %) of the polymer (A). If the content of the structural unit (A2) in the polymer (A) is within the above range, undesirable acid diffusion in the film formed using the acid-transfer composition can be more effectively prevented when the acid generator (B) has generated an acid.

The polymer (A) may include an additional structural unit other than the structural units (A1) and (A2). The additional structural unit is not particularly limited insofar as the object of the invention is not impaired. The content of the additional structural unit in the polymer (A) is not particularly limited, but is preferably 30 mol % or less, and more preferably 1 to 10 mol %, based on the total structural units (=100 mol %) of the polymer (A). The object of the invention is not impaired if the content of the additional structural unit is within the above range.

The molecular weight of the polymer (A) may be appropriately selected. The polystyrene-reduced weight molecular weight (hereinafter referred to as "Mw") of the polymer (A) determined by gel permeation chromatography (GPC) is normally 1000 to 500,000, preferably 2000 to 400,000, and still more preferably 3000 to 300,000.

The ratio (Mw/Mn) of the Mw to the polystyrene-reduced number molecular weight (Mn) of the polymer (A) determined by GPC is not particularly limited, but is normally 1 to 10, preferably 1 to 8, and more preferably 1 to 3.

It is preferable that the polymer (A) be a polymer that substantially does not include a hydroxyl group. The expression "substantially does not include a hydroxyl group" used herein means that the hydroxyl value (i.e., the mass (mg) of potassium hydroxide equivalent to a hydroxyl group in 1 g of the polymer (A)) of polymer (A) measured using an R—OH-bond combination tone (wavelength: 2000 to 2300 nm) and an R—OH first overtone (wavelength: 1380 to 1500 nm) in accordance with JIS K 1557 (Method for Determination of Hydroxyl Value of Plastics—Polyols for Polyurethane Products) is 1 or less.

It is preferable that the polymer (A) be a polymer that substantially does not include the acid-dissociable group (P). The expression "substantially does not include the acid-dissociable group (P)" means that 95 mol % or more of the monomers used to produce the polymer (A) does not include the acid-dissociable group (P). Specifically, the polymer (A) includes a structural unit that includes the acid-dissociable group (P) in an amount of less than 5 mol % based on the total structural units (=100 mol %) of the polymer (A).

The photoacid generator (B) is a compound shown by the following formula (3).

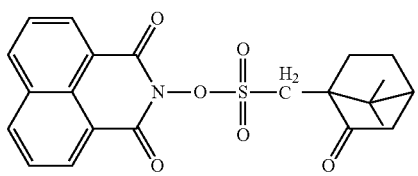
(3)

The photoacid generator (B) makes it possible to form an acid-transfer film that exhibits improved exposure sensitivity and an improved acid-transfer capability. The acid generator (B) generates an acid upon exposure to radiation. The type of radiation used for exposure is not particularly limited. For example, ultraviolet rays, deep ultraviolet rays (including KrF excimer laser light, ArF excimer laser light, and $F_2$ excimer laser light), X-rays, electron beams, γ-rays, molecular beams, ion beams, or the like may be appropriately used.

The acid generator (B) may be used in an arbitrary amount, but is normally used in an amount of 1 to 500 parts by mass based on 100 parts by mass of the polymer (A) so that the acid-transfer film exhibits a sufficient acid-transfer capability. The acid generator (B) is preferably used in an amount of 5 to 300 parts by mass, more preferably 10 to 250 parts by mass, and particularly preferably 20 to 200 parts by mass, so that excellent acid-transfer selectivity (particularly suppression of acid diffusion in the patterning target resin film in the transverse direction) is obtained due to the combination of the acid generator (B) and the polymer (A).

The sensitizer (C) is a compound shown by the following formula (4) (i.e., thioxanethone or a derivative thereof).

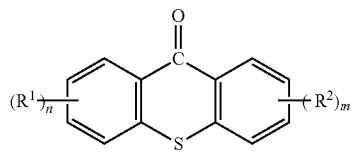
(4)

wherein $R^1$ and $R^2$ individually represent an alkyl group or a halogen atom, and n and m are individually an integer from 1 to 4.

The acid generator (B) exhibits high photosensitivity due to the sensitizer (C).

$R^1$ and $R^2$ and n and m in the formula (4) may respectively be either the same or different. The alkyl group represented by $R^1$ and $R^2$ in the formula (4) may a linear alkyl group, a branched alkyl group, or a cyclic alkyl group. The number of carbon atoms of the alkyl group is not particularly limited. The number of carbon atoms is preferably 1 to 14 when the alkyl group is a linear or branched alkyl group, and is preferably 4 to 20 when the alkyl group is a cyclic alkyl group.

Examples of the linear or branched alkyl group having 1 to 14 carbon atoms include a methyl group, an ethyl group, an n-propyl group, an i-propyl group, an n-butyl group, an i-butyl group, a t-butyl group, a t-pentyl group, a hexyl group, a heptyl group, an octyl group, a nonyl group, a decyl group, an undecyl group, a dodecyl group, and the like. Examples of the cyclic alkyl group having 4 to 20 carbon atoms include a cyclohexyl group and the like. Examples of the halogen atom include a chlorine atom, a bromine atom, an iodine atom, and the like.

Specific examples of the sensitizer (C) include thioxanethone, 2-isopropylthioxanthone (formulas (9-1)), 2,4-dimethylthioxanethone, 2,4-diethylthioxanthone (formula (9-2) (wherein Et indicates an ethyl group)), 2-chlorothioxanthone, 2-dodecylthioxanethone, 1-chloro-4-isopropylthioxanthone (formula (9-3)), 2-cyclohexylthioxanethone (formula (9-4)), and the like. Among these, 2-isopropylthioxanthone, 2,4-diethylthioxanthone, 1-chloro-4-isopropylthioxanthone, and 2-cyclohexylthioxanethone are preferable.

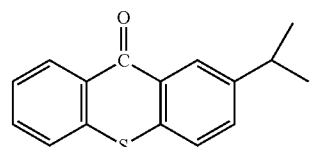
(9-1)

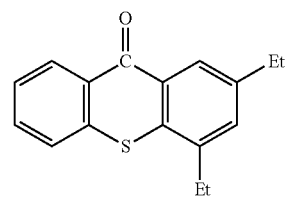
(9-2)

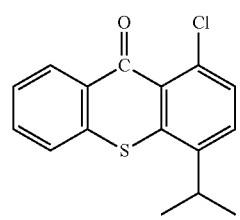
(9-3)

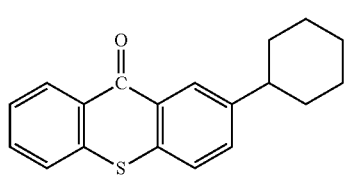
(9-4)

The sensitizer (C) may be used in an arbitrary amount, but is normally used in an amount of 1 to 500 parts by mass based on 100 parts by mass of the acid generator (B) so that the acid-transfer film exhibits a sufficient acid-transfer capability. The sensitizer (C) is preferably used in an amount of 20 to 150 parts by mass, and more preferably 30 to 100 parts by mass, so that an excellent acid-transfer capability is obtained due to the combination of the sensitizer (C) and the acid generator (B).

The acid-transfer composition is normally applied to the surface of the substrate, and dried to form an acid-transfer film. The acid-transfer composition may include (D) a solvent in addition to the polymer (A), the photoacid generator (B), and the sensitizer (C).

The type of the solvent (D) is not particularly limited. For example, water and/or an organic solvent may be used as the solvent (D). These solvents may be used either individually or in combination.

Examples of the organic solvent include propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate;

alkyl ethers such as propylene glycol monomethyl ether, propylene glycol monoethyl ether, ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, dipropyl ether, diisopropyl ether, butyl methyl ether, butyl ethyl ether, butyl propyl ether, dibutyl ether, diisobutyl ether, tert-butyl-methyl ether, tert-butyl ethyl ether, tert-butyl propyl ether, di-tert-butyl ether, dipentyl ether, diisoamyl ether, cyclopentyl methyl ether, cyclohexyl methyl ether, cyclopentyl ethyl ether, cyclohexyl ethyl ether, cyclopentyl propyl ether, cyclopentyl 2-propyl ether, cyclohexyl propyl ether, cyclohexyl 2-propyl ether, cyclopentyl butyl ether, cyclopentyl tert-butyl ether, cyclohexyl butyl ether, and cyclohexyl tert-butyl ether;

alkyl alcohols such as 1-propanol, n-butanol, 2-butanol, 1-pentanol, 2-pentanol, 3-pentanol, 2-methyl-1-propanol, neopentyl alcohol, tert-amyl alcohol, isoamyl alcohol, 3-methyl-2-butanol, 2-methyl-1-butanol, 2-ethyl-1-butanol, 2-methyl-1-pentanol, and 4-methyl-2-pentanol;

hydrocarbons such as decane, dodecane, undecane, benzene, toluene, and xylene; ethyl 2-hydroxy-2-methylpropionate, ethyl ethoxyacetate, ethyl hydroxyacetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl ethyl ether, caproic acid, caprylic acid, 1-octanol, 1-nonanol, benzyl alcohol, ethyl benzoate, diethyl oxalate, diethyl maleate, γ-butyrolactone, ethylene carbonate, propylene carbonate, and the like.

These organic solvents may be used either individually or in combination.

The solvent (D) is normally used in the acid-transfer composition in an amount of 10 to 10,000 parts by mass, preferably 20 to 8000 parts by mass, more preferably 30 to 6000 parts by mass, and still more preferably 40 to 4000 parts by mass, based on 100 parts by mass of the polymer (A).

The viscosity of the acid-transfer composition may be appropriately selected depending on the application method used for the acid-transfer composition and the like. For example, the viscosity of the acid-transfer composition at 25° C. may be 1 to 100 mPa·s. The viscosity of the acid-transfer composition is preferably 2 to 80 mPa·s, and more preferably 3 to 50 mPa·s.

The acid-transfer composition may further include an additional component other than the solvent (D). The additional component may be (E) a surfactant. Examples of the surfactant (E) include a nonionic surfactant, an anionic surfactant, a cationic surfactant, an amphoteric surfactant, a silicone surfactant, a polyalkylene oxide surfactant, a fluorine-containing surfactant, and the like.

Specific examples of the surfactant include polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, polyethylene glycol distearate, and the like. These surfactants may be used either individually or in combination.

The surfactant (E) is normally used in an amount of 0.01 to 0.5 parts by mass, and preferably 0.02 to 0.1 parts by mass, based on 100 parts by mass of the polymer (A).

The acid-transfer composition may further include a crosslinking agent, a halation inhibitor, a storage stabilizer, a coloring agent, a plasticizer, an anti-foaming agent, and the like.

[2] Microarray

A microarray according to one embodiment of the invention is produced by the compound synthesis method according to one embodiment of the invention. The microarray has a configuration in which a specific number of compounds are synthesized and disposed in specific areas of the surface of a substrate. The compounds may be the compounds described above in connection with the compound synthesis method according to one embodiment of the invention. The term "microarray" used herein includes a biochip and the like.

[3] Acid-Transfer Composition

An acid-transfer composition according to one embodiment of the invention includes (A) a polymer, (B) a photoacid generator, and (C) a sensitizer, and is used for a compound synthesis method that includes (P1) a first film-forming step, (P2) a second film-forming step, (P3) a protecting group-removing step, (P4) a second film-removing step, and (P5) a second compound-bonding step, and synthesizes a compound in which a first compound and a second compound are bonded.

The description given above in connection with the compound synthesis method may be applied to the polymer (A), the photoacid generator (B), and the sensitizer (C) included in the acid-transfer composition. The description given above in connection with the compound synthesis method may be applied to other details of the acid-transfer composition. The description given above in connection with the compound synthesis method may be applied to the compound synthesis method using the acid-transfer composition.

[4] Biochip Composition

A biochip composition according to one embodiment of the invention includes (A) a polymer, (B) a photoacid generator, and (C) a sensitizer.

The description given above in connection with the compound synthesis method may be applied to the polymer (A), the photoacid generator (B), and the sensitizer (C) included in the biochip composition. The description given above in connection with the compound synthesis method may be applied to other details of the biochip composition.

The biochip produced using the biochip composition according to one embodiment of the invention includes a substrate, and a probe that is disposed on the substrate, and includes a first film that may be the first film formed by the compound synthesis method, and the like. Examples of the probe include DNA, RNA, PNA, BNA, artificial nucleic acid, a protein (peptide), a sugar chain, a combination (probe) thereof, and the like.

Specific examples of the biochip include a DNA chip, an RNA chip, a protein chip, a sugar chain chip, and the like. The biochip may be a composite chip that has two or more functions.

The biochip normally has a configuration in which several thousand to several tens of thousand probes are formed on a square substrate (each side has a dimension of 1 to 10 mm), and can simultaneously analyze the expression pattern of samples (e.g., DNA). The biochip may suitably used for gene expression patterning, novel gene screening, and detection of gene polymorphism, gene mutation, and the like.

EXAMPLES

The invention is further described below by way of examples. Note that the invention is not limited to the following examples. In the following examples, the units "parts" and "%" respectively refer to "parts by mass" and "mass %" unless otherwise indicated.

[1] Production of Acid-Transfer Composition (Examples 1 to 8 and Comparative Examples 1 to 3)
(1) Synthesis of Polymer (A)
Synthesis of Polymer (A-1)

In Synthesis Example 1, N,N-dimethylacrylamide shown by the following formula (10) was used as the monomer (Am1) for introducing the structural unit (A1) shown by the formula (1), and methyl methacrylate was used as the monomer (Am2) for introducing the structural unit (A2) shown by the formula (2).

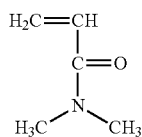
(10)

A 500 ml beaker was charged with 5 g of N,N-dimethylacrylamide (monomer Am1) (5 mol % based on the total (=100 mol %) of the monomers Am1 and Am2), 95 g of methyl methacrylate (monomer Am2) (95 mol % based on the total (=100 mol %) of the monomers Am1 and Am2), and 3.0 g of 2,2'-azobisisobutyronitrile (initiator). The mixture was stirred until the initiator was dissolved to obtain a homogeneous solution. A flask equipped with a dry ice/methanol reflux condenser, of which the atmosphere had been replaced with nitrogen, was charged with 150 g of propylene glycol monomethyl ether acetate (solvent). The propylene glycol monomethyl ether acetate was heated to 80° C. with gentle stirring. The above solution was then slowly added dropwise to the flask over 2 hours. After the addition, the monomers were polymerized at 80° C. for 3 hours. After heating the mixture to 100° C., the mixture was stirred for 1 hour to complete polymerization. The reaction solution was added dropwise to a large quantity of cyclohexane to coagulate the product. The coagulated product was washed with water, and dissolved in an equal mass of tetrahydrofuran. The solution was added dropwise to a large quantity of cyclohexane to coagulate the product. This dissolution-coagulation cycle was performed seven times in total. The resulting coagulated product was dried at 40° C. for 48 hours under vacuum to obtain a polymer (A-1). The yield of the polymer (A-1) was 55%. The polymer (A-1) had an Mw of 11,000, an Mw/Mn ratio of 2.3, and a purity of 99% or more.

Synthesis of Polymer (A-2)

In Synthesis Example 2, a polymer was synthesized in the same manner as Synthesis Example 1, except for changing the amount of each monomer.

Specifically, 10 g of N,N-dimethylacrylamide (monomer Am1) (10 mol % based on the total (=100 mol %) of the monomers Am1 and Am2) and 90 g of methyl methacrylate (monomer Am2) (90 mol % based on the total (=100 mol %) of the monomers Am1 and Am2) were polymerized in the same manner as in Synthesis Example 1 to obtain a polymer (A-2). The yield of the polymer (A-2) was 48%. The polymer (A-2) had an Mw of 10,000, an Mw/Mn ratio of 2.3, and a purity of 99% or more.

Synthesis of Polymer (A-3)

In Synthesis Example 3, a polymer was synthesized in the same manner as Synthesis Example 1, except for changing the amount of each monomer. Specifically, 20 g of N,N-dimethylacrylamide (monomer Am1) (20 mol % based on the total (=100 mol %) of the monomers Am1 and Am2) and 80 g of methyl methacrylate (monomer Am2) (80 mol % based on the total (=100 mol %) of the monomers Am1 and Am2) were polymerized in the same manner as in Synthesis Example 1 to obtain a polymer (A-3). The yield of the polymer (A-3) was 50%. The polymer (A-3) had an Mw of 9000, an Mw/Mn ratio of 2.3, and a purity of 99% or more.

The polymers (A-1) to (A-3) are summarized in Table 1.

TABLE 1

| Polymer A | Component (parts by mass) | | Weight average molecular weight |
|---|---|---|---|
| | Am1: N,N-dimethylacrylamide | Am2: methyl methacrylate | |
| A-1 | 5 | 95 | 11,000 |
| A-2 | 10 | 90 | 10,000 |
| A-3 | 20 | 80 | 9,000 |

Acid Generator (B)

A solution was prepared by dissolving 5 g of an acid generator (commercially available product) shown by the following formula (3) and including an imidosulfonate group in 200 g of propylene glycol monomethyl ether acetate (organic layer), and washed five times with 300 ml of water. The organic layer was then dried over anhydrous magnesium sulfate. Magnesium sulfate was then removed by filtration, and the solvent (propylene glycol monomethyl ether acetate) was evaporated under reduced pressure. The resulting amorphous solid was dissolved in 100 ml of propylene glycol monomethyl ether acetate. The solution was added dropwise to 300 ml of a mixed solvent of n-heptane and isopropyl alcohol to effect recrystallization. The resulting crystal was filtered off, and dried under vacuum to obtain an acid generator B (yield: 3.1 g, purity: 99.9% or more).

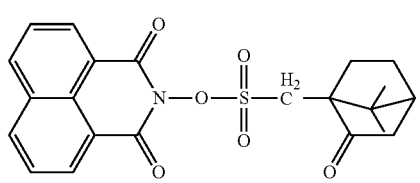
(3)

Sensitizer (C)

5 g of 2-isopropylthioxanthone (commercially available product) shown by the following formula (9-1) was dissolved in 100 g of cyclohexanone. The solution was added dropwise to 300 ml of isopropyl alcohol to effect recrystallization. The resulting crystal was filtered off, and dried under vacuum to obtain a sensitizer C (yield: 2.5 g, purity: 99.9% or more).

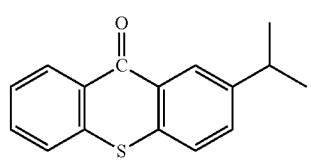
(9-1)

Solvents D1 and D2 were used as the solvent (D). The solvent D1 was propylene glycol monomethyl ether acetate, and used in an amount of 80 parts by mass based on 100 parts by mass of the polymer (A). The solvent D2 was γ-butyrolactone, and used in an amount of 20 parts by mass based on 100 parts by mass of the polymer (A). The solvents D1 and D2 were used as a mixed solvent.

The above components were mixed in amounts shown in Table 2, and stirred to obtain a homogenous solution having a solid content shown in Table 2. The solution was filtered through a capsule filter (pore size: 0.5 µm) to obtain an acid-transfer composition (Examples 1 to 8 and Comparative Examples 1 to 3).

ether acetate (solvent) were mixed, and stirred to obtain a homogeneous solution. The solution was filtered through a capsule filter (pore size: 0.5 µm) to obtain a liquid (first film-forming composition) containing the first compound.

The Mw was determined as follows in each synthesis example. Specifically, the Mw was determined by gel permeation chromatography (GPC) (standard: monodispersed polystyrene) using a GPC column manufactured by Tosoh Corp. (G200HXL×2, G3000HXL×1, G4000HXL×1) (flow

TABLE 2

|  |  | Polymer (A) |  | Acid generator (B) | Compound (C) | Solvent (D) | Solid |
|---|---|---|---|---|---|---|---|
|  |  | Type | Amount (parts by mass) | Amount (parts by mass) | Amount (parts by mass) | Amount (parts by mass) | content (%) |
| Example | 1 | A-1 | 100 | 43 | 43 | 100 | 13.0 |
|  | 2 | A-2 | 100 | 43 | 43 | 100 | 13.0 |
|  | 3 | A-3 | 100 | 43 | 43 | 100 | 13.0 |
|  | 4 | A-3 | 100 | 20 | 43 | 100 | 13.0 |
|  | 5 | A-3 | 100 | 100 | 43 | 100 | 13.0 |
|  | 6 | A-3 | 100 | 150 | 43 | 100 | 13.0 |
|  | 7 | A-3 | 100 | 200 | 43 | 100 | 13.0 |
|  | 8 | A-3 | 100 | 25 | 25 | 100 | 13.0 |
| Comparative | 1 | A-1 | 100 | 43 | 0 | 100 | 13.0 |
| Example | 2 | A-2 | 100 | 43 | 0 | 100 | 13.0 |
|  | 3 | A-3 | 100 | 43 | 0 | 100 | 13.0 |

[2] Production of First Compound and Liquid Containing the Same

An acid-dissociable group-containing resin was used as the first compound including an acid-labile protecting group (acid-dissociable group). The acid-dissociable group-containing resin was produced using bis-(4-methoxyphenyl)-benzyl acrylate (i.e., a monomer including an acid-dissociable group). p-Isopropenylphenol was used as a monomer including a phenolic hydroxyl group, and p-hydroxyphenyl-methacrylamide, hydroxyethyl acrylate, and phenoxy polyethylene glycol acrylate were used as other monomers.

20 g of bis-(4-methoxyphenyl)-benzyl acrylate, 30 g of p-isopropenylphenol, 20 g of p-hydroxyphenylmethacrylamide, 20 g of hydroxyethyl acrylate, 10 g of phenoxypolyethylene glycol acrylate, and 120 g of propylene glycol monomethyl ether acetate (solvent) were mixed, and stirred to prepare a homogeneous solution.

Nitrogen gas was bubbled into the resulting solution for 30 minutes. After the addition of 4 g of 2,2'-azobisisobutyronitrile (AIBN) (initiator), the monomers were polymerized at 70° C. for 3 hours while bubbling nitrogen gas into the mixture. After the addition of 1 g of AIBN, the mixture was reacted for 3 hours, and then reacted at 100° C. for 1 hour to complete polymerization. The resulting reaction solution was mixed with a large quantity of hexane to coagulate the product contained in the reaction solution. After dissolving the coagulate in tetrahydrofuran, the product was again coagulated using hexane. This operation was repeated several times to remove unreacted monomers. The polymer was dried at 50° C. under reduced pressure to obtain an acid-dissociable group-containing resin (first compound).

The yield of the acid-dissociable group-containing resin (first compound) was 95%. The acid-dissociable group-containing resin had an Mw of 15,000, and an Mw/Mn ratio of 2.5.

100 parts by mass of the first compound, 0.05 parts by mass of "NBX-15" (manufactured by Neos Co., Ltd.) (surfactant), and 2000 parts by mass of propylene glycol monomethyl rate: 1.0 ml/min, column temperature: 40° C., eluant: tetrahydrofuran). The dispersity (Mw/Mn) was calculated from the measurement results.

[3] Compound Synthesis Method (1) First Film-Forming Step (P1)

The liquid containing the first compound obtained in [2] was applied to the surface of a silicon substrate using a spin coater. The liquid was heated at 110° C. for 1 minute on a hot plate to form a first film having a thickness of 300 nm.

(2) Second Film-Forming Step (P2)

The acid-transfer composition obtained in [1] (Examples 1 to 8 and Comparative Examples 1 to 3) was applied to the surface of the first film obtained in (1) using a spin coater. The composition was heated at 100° C. for 1 minute on a hot plate to form a second film having a thickness of 300 nm.

(3) Protecting Group-Removing Step (P3)

(3-1) Exposure Step (P31)

The surface of the second film obtained in (2) was exposed to ultraviolet rays via a pattern mask at a dose of 100 to 1200 mJ/cm$^2$ using an ultra-high-pressure mercury lamp ("HBO" manufactured by OSRAM, output: 1000 W). The dose was measured using an illuminometer ("UV-M10" manufactured by ORC Manufacturing Co., Ltd.) connected to a photodetector "Probe UV-35".

(3-2) Acid-Transfer Step (P32)

The laminate obtained in (3-1) was heated at 110° C. for 1 minute on a hot plate.

(4) Second Film-Removing Step (P4)

The laminate obtained in (3-2) was immersed in acetonitrile for 30 seconds to remove the second film.

(5) Second Compound-Bonding Step (P5)

An amino group (free amino group) formed by dissociation of the protecting group from the first film in the protecting group-removing step (P3) and exposed on the surface of the substrate in the second film-removing step (P4) was reacted in a DMF solution containing 1 mM fluorescein isothiocyanate (second compound) (manufactured by Aldrich) at room temperature for 1 hour to form a fluorescent label. The substrate was washed with ethanol, water, and ethanol in this order, dried, and kept in a darkroom.

[4] Evaluation (Evaluation of Spot Shape and Sensitivity)

Spots (absorption regions of isothiocyanate group) formed on the surface of the substrate obtained in the second compound-bonding step (P5) were observed using a laser Raman spectrometer (manufactured by Renishaw), and whether or not each spot shape was formed to dimensions of 50×50 μm accurately corresponding to the pattern mask was determined. The number of absorption regions that did not have dimensions of 50×50 μm was counted, and evaluated in accordance with the following standard. The results are shown in Table 3. The sensitivity shown in Table 3 refers to the minimum dose used in the exposure step (P31) at which an area having dimensions of 50×50 μm was formed.

Good: No defective spot was observed.
Fair: The number of defective spots was 50% or less of the total number of spots.
Bad: The number of defective spots was more than 50% of the total number of spots.

TABLE 3

|  |  | Sensitivity (mJ · cm$^{-2}$) | Spot shape |
|---|---|---|---|
| Example | 1 | 100 | Good |
|  | 2 | 100 | Good |
|  | 3 | 150 | Good |
|  | 4 | 500 | Good |
|  | 5 | 75 | Good |
|  | 6 | 50 | Good |
|  | 7 | 50 | Good |
|  | 8 | 100 | Good |
| Comparative Example | 1 | 1000 | Good |
|  | 2 | 1100 | Good |
|  | 3 | 1200 | Good |

Note that the invention is not limited to the above embodiments and examples. Various modifications and variations may be appropriately made without departing from the scope of the invention depending on the objective and the application.

Obviously, numerous modifications and variations of the present invention are possible in the light of the above teachings. It is therefore to be understood that within the scope of the appended claims, the invention may be practiced otherwise than as specifically described herein.

What is claimed is:

1. A compound synthesis method comprising:
bonding a first compound that includes an acid-labile protecting group to a substrate to form a first film;
forming a second film on the first film using an acid-transfer composition, the acid-transfer composition including (A) a polymer that includes a structural unit shown by a following formula (1) and a structural unit shown by a following formula (2), (B) a photoacid generator including a compound shown by a following formula (3), (C) a sensitizer including a compound shown by a following formula (4), and (D) a solvent which does not include ketone;
exposing the second film to remove the protecting group from the first compound under an exposed area of the second film;
transferring an acid generated in the exposed area of the second film to the first film;
removing the second film after being exposed; and
bonding a second compound to the first compound from which the protecting group has been removed to synthesize a compound in which the first compound and the second compound are bonded,

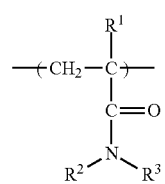

wherein
R$^1$ represents a hydrogen atom or a methyl group, and
each of R$^2$ and R$^3$ independently represents a hydrogen atom, a linear or branched hydrocarbon group having 1 to 10 carbon atoms, or a cyclic hydrocarbon group having 3 to 10 carbon atoms, or
each of R$^2$ and R$^3$ independently represents a hydrogen atom, a linear or branched hydrocarbon group having 1 to 10 carbon atoms, or a cyclic hydrocarbon group having 3 to 10 carbon atoms, and R$^2$ and R$^3$ bond to form a 3 to 10-membered monocyclic hetero ring, or bond via at least one hetero atom selected from a nitrogen atom, an oxygen atom, a sulfur atom, and a selenium atom to form a 4 to 10-membered monocyclic hetero ring,

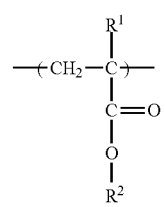

wherein
R$^1$ represents a hydrogen atom or a methyl group, and
R$^2$ represents a monovalent organic group,

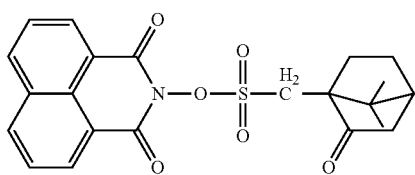

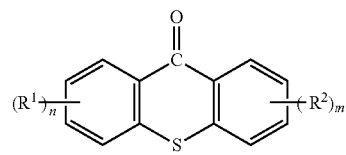

wherein
each of R$^1$ and R$^2$ independently represents an alkyl group or a halogen atom, and
each of n and m is independently an integer from 1 to 4.

2. The compound synthesis method according to claim 1, wherein a content of the photoacid generator (B) in the acid-transfer composition is 30 to 200 parts by mass based on 100 parts by mass of the polymer (A).

3. The compound synthesis method according to claim 1, wherein the substrate is formed of silicon, silicon dioxide, glass, polypropylene, or polyacrylamide.

4. The compound synthesis method according to claim 1, wherein the first compound is bonded indirectly to the substrate.

5. The compound synthesis method according to claim 1, wherein the compound in which the first compound and the second compound are bonded is a probe included in a biochip.

6. The compound synthesis method according to claim 5, wherein the second compound is (1) a compound selected from a group consisting of nucleotides, amino acids, and monosaccharides, or (2) a conjugate of two or more compounds selected from the group consisting of nucleotides, amino acids, and monosaccharides.

7. An acid-transfer composition comprising:
(A) a polymer that includes a structural unit shown by a following formula (1) and a structural unit shown by a following formula (2);
(B) a photoacid generator including a compound shown by a following formula (3);
(C) a sensitizer including a compound shown by a following formula (4); and
(D) a solvent which does not include ketone, the acid-transfer composition being used for a compound synthesis method including:
bonding a first compound that includes an acid-labile protecting group to a substrate to form a first film;
forming a second film on the first film using the acid-transfer composition;
exposing the second film to remove the protecting group from the first compound under an exposed area of the second film;
transferring an acid generated in the exposed area of the second film to the first film;
removing the second film after being exposed; and
bonding a second compound to the first compound from which the protecting group has been removed to synthesize a compound in which the first compound and the second compound are bonded,

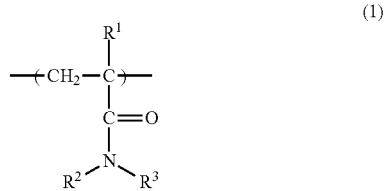
(1)

wherein
$R^1$ represents a hydrogen atom or a methyl group, and
each of $R^2$ and $R^3$ independently represents a hydrogen atom, a linear or branched hydrocarbon group having 1 to 10 carbon atoms, or a cyclic hydrocarbon group having 3 to 10 carbon atoms, or
each of $R^2$ and $R^3$ independently represents a hydrogen atom, a linear or branched hydrocarbon group having 1 to 10 carbon atoms, or a cyclic hydrocarbon group having 3 to 10 carbon atoms, and $R^2$ and $R^3$ bond to form a 3 to 10-membered monocyclic hetero ring, or bond via at least one hetero atom selected from a nitrogen atom, an oxygen atom, a sulfur atom, and a selenium atom to form a 4 to 10-membered monocyclic hetero ring,

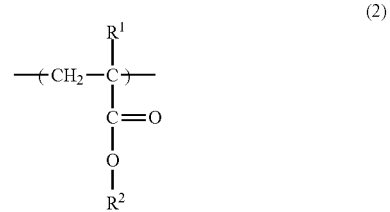
(2)

wherein
$R^1$ represents a hydrogen atom or a methyl group, and
$R^2$ represents a monovalent organic group,

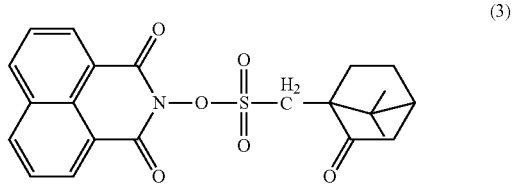 [SMILES: CC1(C)C2CCC1(CS(=O)(=O)ON1C(=O)c3cccc4cccc(c34)C1=O)C(=O)C2]
(3)

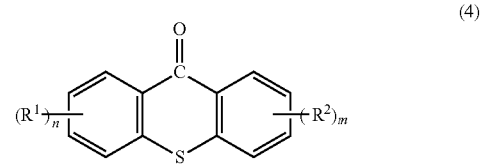
(4)

wherein
each of $R^1$ and $R^2$ independently represents an alkyl group or a halogen atom, and
each of n and m is independently an integer from 1 to 4.

8. The acid-transfer composition according to claim 7, wherein a content of the photoacid generator (B) in the acid-transfer composition is 30 to 200 parts by mass based on 100 parts by mass of the polymer (A).

9. The acid-transfer composition according to claim 7, wherein the substrate is formed of silicon, silicon dioxide, glass, polypropylene, or polyacrylamide.

10. The acid-transfer composition according to claim 7, wherein the first compound is bonded indirectly to the substrate.

11. The compound synthesis method according to claim 1, wherein the solvent is selected from the group consisting of propylene glycol monoalkyl ether acetate, alkyl ether, alkyl alcohol, hydrocarbon, ethyl 2-hydroxy-2-methylpropionate, ethyl ethoxyacetate, ethyl hydroxyacetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl ethyl ether, caproic acid, caprylic acid, 1-octanol, 1-nonanol, benzyl alcohol, ethyl benzoate, diethyl oxalate, diethyl maleate, γ-butyrolactone, ethylene carbonate, propylene carbonate, and a mixture thereof.

12. The acid-transfer composition according to claim 7, wherein the solvent is selected from the group consisting of propylene glycol monoalkyl ether acetate, alkyl ether, alkyl alcohol, hydrocarbon, ethyl 2-hydroxy-2-methylpropionate, ethyl ethoxyacetate, ethyl hydroxyacetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl ethyl ether, caproic acid, caprylic acid, 1-octanol, 1-nonanol, benzyl alcohol, ethyl benzoate, diethyl oxalate, diethyl maleate, γ-butyrolactone, ethylene carbonate, propylene carbonate, and a mixture thereof.

\* \* \* \* \*